US011710709B2

(12) United States Patent
Kaizu et al.

(10) Patent No.: US 11,710,709 B2
(45) Date of Patent: Jul. 25, 2023

(54) TERMINAL MEMBER MADE OF PLURALITY OF METAL LAYERS BETWEEN TWO HEAT SINKS

(71) Applicant: DENSO CORPORATION, Kariya (JP)

(72) Inventors: Ryoichi Kaizu, Kariya (JP); Takumi Nomura, Kariya (JP); Tetsuto Yamagishi, Kariya (JP); Yuki Inaba, Kariya (JP); Yoshitsugu Sakamoto, Kariya (JP)

(73) Assignee: DENSO CORPORATION, Kariya (JP)

(*) Notice: Subject to any disclaimer, the term of this patent is extended or adjusted under 35 U.S.C. 154(b) by 288 days.

(21) Appl. No.: 17/228,033

(22) Filed: Apr. 12, 2021

(65) Prior Publication Data

US 2021/0233871 A1  Jul. 29, 2021

Related U.S. Application Data

(63) Continuation of application No. PCT/JP2019/034331, filed on Sep. 2, 2019.

(30) Foreign Application Priority Data

Oct. 15, 2018  (JP) .................. 2018-194377

(51) Int. Cl.
*H01L 23/31* (2006.01)
*H01L 23/495* (2006.01)
(Continued)

(52) U.S. Cl.
CPC .......... *H01L 23/562* (2013.01); *B23K 35/264* (2013.01); *B23K 35/30* (2013.01);
(Continued)

(58) Field of Classification Search
CPC ............. H01L 2924/181; H01L 23/562; H01L 23/3107; H01L 23/49513; H01L 23/4952;
(Continued)

(56) References Cited

U.S. PATENT DOCUMENTS 9,960,096 B2 * 5/2018 Okumura ............ H01L 23/3672
10,147,671 B2 * 12/2018 Hayashi .............. H01L 23/3142
(Continued)

FOREIGN PATENT DOCUMENTS

JP  2004-296837 A  10/2004
JP  2013-098228 A  5/2013
(Continued)

*Primary Examiner* — Alonzo Chambliss
(74) *Attorney, Agent, or Firm* — Posz Law Group, PLC

(57) ABSTRACT

A semiconductor device includes a semiconductor chip made of a SiC substrate and having main electrodes on one surface and a rear surface, first and second heat sinks, respectively, disposed adjacent to the one surface and the rear surface, a terminal member interposed between the second heat sink and the semiconductor chip, and a plurality of bonding members disposed between the main electrodes, the first and second heat sinks, and the terminal member. The terminal member includes plural types of metal layers symmetrically layered in the plate thickness direction. The terminal member as a whole has a coefficient of linear expansion at least in a direction orthogonal to the plate thickness direction in a range larger than that of the semiconductor chip and smaller than that of the second heat sink.

10 Claims, 13 Drawing Sheets

(51) Int. Cl.
  *H01L 23/00* (2006.01)
  *B23K 35/26* (2006.01)
  *B23K 35/30* (2006.01)
  *C22C 12/00* (2006.01)
  *H02P 27/06* (2006.01)

(52) U.S. Cl.
  CPC .......... *C22C 12/00* (2013.01); *H01L 23/3107* (2013.01); *H01L 23/4952* (2013.01); *H01L 23/49513* (2013.01); *H01L 23/49562* (2013.01); *H01L 23/49568* (2013.01); *H01L 23/49575* (2013.01); *H01L 23/49582* (2013.01); *H01L 24/29* (2013.01); *H01L 2224/2922* (2013.01); *H01L 2224/29213* (2013.01); *H01L 2224/29239* (2013.01); *H01L 2224/29247* (2013.01); *H01L 2224/29255* (2013.01); *H01L 2924/014* (2013.01); *H01L 2924/10272* (2013.01); *H01L 2924/13091* (2013.01); *H01L 2924/15747* (2013.01); *H01L 2924/181* (2013.01); *H01L 2924/3511* (2013.01); *H02P 27/06* (2013.01)

(58) Field of Classification Search
  CPC ......... H01L 23/49562; H01L 23/49568; H01L 23/49575; H01L 23/49582; H01L 23/36; H01L 24/29
  See application file for complete search history.

(56) References Cited

U.S. PATENT DOCUMENTS

| | | | |
|---|---|---|---|
| 2005/0056927 | A1 | 3/2005 | Teshima et al. |
| 2006/0145335 | A1 | 7/2006 | Teshima et al. |
| 2009/0116197 | A1* | 5/2009 | Funakoshi .......... H01L 21/4882 438/122 |
| 2009/0302444 | A1* | 12/2009 | Ueda .................... H01L 25/117 438/109 |
| 2012/0074556 | A1 | 3/2012 | Hanada |
| 2012/0186800 | A1 | 7/2012 | Terao et al. |
| 2013/0313574 | A1 | 11/2013 | Hanada |
| 2016/0056570 | A1 | 2/2016 | Yoshikawa et al. |
| 2017/0278774 | A1* | 9/2017 | Hayashi ............ H01L 23/49562 |

FOREIGN PATENT DOCUMENTS

| | | |
|---|---|---|
| JP | 2013-229472 A | 11/2013 |
| JP | 2015-050228 A | 3/2015 |
| JP | 2016-086069 A | 5/2016 |
| JP | 2016-105523 A | 6/2016 |
| JP | 2016-115807 A | 6/2016 |
| JP | 2016-134601 A | 7/2016 |
| JP | 2018-116994 A | 7/2018 |

* cited by examiner

TERMINAL MEMBER MADE OF PLURALITY OF METAL LAYERS BETWEEN TWO HEAT SINKS

CROSS REFERENCE TO RELATED APPLICATIONS

The present application is a continuation application of International patent Application No. PCT/JP2019/034331 filed on Sep. 2, 2019, which designated the U.S. and claims the benefit of priority from Japanese Patent Application No. 2018-194377 filed on Oct. 15, 2018. The entire disclosures of all of the above applications are incorporated herein by reference.

TECHNICAL FIELD

The present disclosure relates to a semiconductor device.

BACKGROUND

It has proposed a semiconductor device having a double sided heat dissipation structure. Such a semiconductor device includes a semiconductor chip, a pair of heat sinks, and a terminal member. The semiconductor chip has an element, such as an insulated gate bipolar transistor (IGBT) or a MOSFET, formed in a silicon substrate, and includes main electrodes on one surface and a rear surface opposite to the one surface, respectively. The pair of heat sinks include a first heat sink disposed adjacent to the one surface of the semiconductor chip and a second heat sink disposed adjacent to the rear surface of the semiconductor chip. The terminal member is interposed between the second heat sink and the semiconductor chip and electrically interconnects the second heat sink and the semiconductor chip. The semiconductor chip and the first heat sink, the semiconductor chip and the terminal member, and the terminal member and the second heat sink are connected through bonding members, respectively.

SUMMARY

The present disclosure describes a semiconductor device including a semiconductor chip, first and second heat sinks, a terminal member, and a plurality of bonding members. The semiconductor chip has a SiC substrate formed with an element, and main electrodes on one surface and a rear surface opposite to the one surface in a plate thickness direction of the semiconductor chip. The first heat sink and second heat sink, as a pair of heat sinks, are disposed so as to interpose the semiconductor chip therebetween in the plate thickness direction, so that the first heat sink is adjacent to the one surface of the semiconductor chip and the second heat sink is adjacent to the rear surface of the semiconductor chip. The terminal member is interposed between the second heat sink and the semiconductor chip, and electrically interconnects the second heat sink and the main electrode on the rear surface. The plurality of bonding members are disposed between the main electrode on the one surface and the first heat sink, between the main electrode on the rear surface and the terminal member, and between the terminal member and the second heat sink, respectively. The terminal member is provided by a plurality of types of metal layers that are stacked in the plate thickness direction. The terminal member as a whole has a coefficient of linear expansion at least in a direction orthogonal to the plate thickness direction in a range larger than that of the semiconductor chip and smaller than that of the second heat sink. The plurality of types of metal layers of the terminal member are symmetrically arranged in the plate thickness direction.

BRIEF DESCRIPTION OF DRAWINGS

Objects, features and advantages of the present disclosure will become more apparent from the following detailed description made with reference to the accompanying drawings, in which.

DETAILED DESCRIPTION

Figure 1:
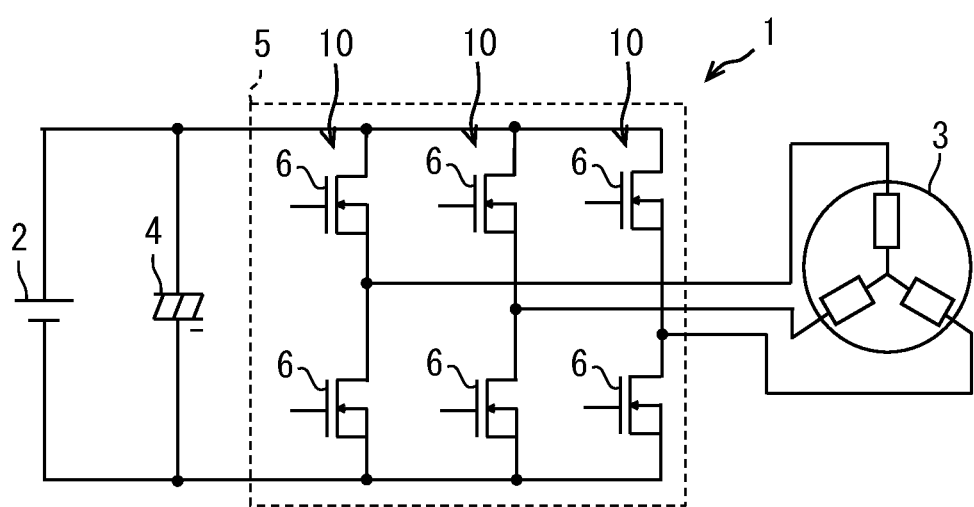
FIG. 1 is a diagram showing a configuration of a power conversion device to which a semiconductor device according to a first embodiment is applied.

In recent years, SiC has attracted attention because it has characteristics such as a larger dielectric breakdown field and band gap, a higher thermal conductivity, and a faster electron saturation velocity than Si. However, SiC has Young's modulus about three times larger than that of Si. Therefore, in the above described double sided heat dissipation structure in which the semiconductor chip is interposed between the heat sinks from its top and bottom, when SiC is used for the semiconductor chip, there is a fear of cracks in the bonding member or the semiconductor chip.

According to a first aspect of the present disclosure, a semiconductor device includes: a semiconductor chip having a SiC substrate formed with an element and including main electrodes on one surface and a rear surface opposite to the one surface in a plate thickness direction; a first heat sink and a second heat sink, as a pair of heat sinks, being disposed so as to interpose the semiconductor chip therebetween in the plate thickness direction, the first heat sink being adjacent to the one surface of the semiconductor chip, the second heat sink being adjacent to the rear surface of the semiconductor chip; a terminal member being interposed between the second heat sink and the semiconductor chip and electrically interconnecting the second heat sink and the main electrode on the rear surface; and a plurality of bonding members being disposed between the main electrode on the one surface and the first heat sink, between the main electrode on the rear surface and the terminal member, and between the terminal member and the second heat sink, respectively. The terminal member is made of a plurality of types of metal layers that are layered in the plate thickness direction. A coefficient of linear expansion at least in a direction orthogonal to the plate thickness direction as a whole of the terminal member is set to be in a range larger than that of the semiconductor chip and smaller than that of the second heat sink. The plurality of types of metal layers of the terminal member are symmetrically arranged in the plate thickness direction.

According to the aspect of the present disclosure described above, in the semiconductor device, the terminal member is made up of a plurality of types of metal layers that are layered, and the coefficient of linear expansion of the terminal member at least in the direction orthogonal to the plate thickness direction is set to a value between that of the semiconductor chip and that of the second heat sink. Therefore, the thermal stress acting on each of the bonding members or the semiconductor chip can be reduced. Further, the metal layers are symmetrically arranged in the plate thickness direction. Thus, warpage of the terminal member can be suppressed, and a local stress acting on each of the bonding members or the semiconductor chip can be suppressed. As such, the configuration according to the first aspect is suitable for the semiconductor device of a double sided heat dissipation structure in which SiC is used for the semiconductor chip.

According to a second aspect of the present disclosure, a semiconductor device includes: a semiconductor chip having a SiC substrate formed with an element and including main electrodes on one surface and a rear surface opposite to the one surface in a plate thickness direction; a first heat sink and a second heat sink, as a pair of heat sinks, being disposed so as to interpose the semiconductor chip therebetween in the plate thickness direction, the first heat sink being adjacent to the one surface of the semiconductor chip, the second heat sink being adjacent to the rear surface of the semiconductor chip; a terminal member being interposed between the second heat sink and the semiconductor chip and electrically interconnecting the second heat sink and the main electrode on the rear surface; and a plurality of bonding members being disposed between the main electrode on the one surface and the first heat sink, between the main electrode on the rear surface and the terminal member, and between the terminal member and the second heat sink, respectively. The terminal member is a clad member of three or more layers in which a Cu layer and an alloy layer containing Cu and Cr are layered in sequence in the plate thickness direction, and the Cu layer and the alloy layer are symmetrically arranged in the plate thickness direction.

According to the second aspect of the present disclosure, in the semiconductor device, the terminal member is a clad member with a Cu layer and an alloy layer containing Cu and Cr. By including the alloy layer, the expansion of the Cu layer in a direction orthogonal to the plate thickness direction is restricted, and the coefficient of linear expansion in the orthogonal direction can be reduced as a whole of the terminal member. Therefore, the thermal stress acting on each of the bonding members or the semiconductor chip can be reduced. Further, the Cu layer and the alloy layer are symmetrically arranged in the plate thickness direction. Thus, warpage of the terminal member can be suppressed, and a local stress acting on each of the bonding members or the semiconductor chip can be suppressed. As such, the configuration according to the second aspect is suitable for the semiconductor device of a double sided heat dissipation structure in which SiC is used for the semiconductor chip.

A plurality of embodiments and modifications will be described with reference to the drawings. In the embodiments and modifications, functionally and/or structurally corresponding parts are denoted by the same reference numerals. Hereinafter, a plate thickness direction of a semiconductor chip is referred to as a Z direction, and an arrangement direction of semiconductor chips, which is orthogonal to the Z direction, is referred to as an X direction. Further, a direction orthogonal to both the Z direction and the X direction is referred to as a Y direction. Unless otherwise specified, a shape in an XY plane view (a shape along an XY plane) is referred to as a planar shape. It can be said that the XY plane view is a projection view in the Z direction.

First Embodiment

In the following, H at the end of a reference numeral indicates that a corresponding element belongs to an upper arm, and L at the end of a reference numeral indicates that a corresponding element belongs to a lower arm. Some elements are indicated with H and L at the ends of the reference numerals thereof in order to clarify the upper arm and the lower arm, and some other elements are indicated with the common reference numerals irrespective to the upper arm and the lower arm.

(Configuration of Power Conversion Device)

A power conversion device 1 shown in FIG. 1 is mounted on, for example, an electric vehicle or a hybrid vehicle. The power conversion device 1 is configured to convert a DC voltage supplied from a DC power source 2 of a vehicle into three phase AC and output the converted voltage to a motor 3 of a three phase AC system. The motor 3 functions as a travel driving source of the vehicle. The power conversion device 1 can also convert an electric power generated by the motor 3 into a DC and charge the DC power source 2. In this manner, the power conversion device 1 is capable of performing a bidirectional power conversion.

The power conversion device 1 includes a smoothing capacitor 4 and an inverter 5 as a power converter. The smoothing capacitor 4 has a positive electrode terminal connected to a positive electrode of the DC power source 2, which is a high potential side electrode of the DC power source 2, and a negative electrode terminal connected to a negative electrode of the DC power source 2, which is a low potential side electrode of the DC power source 2. The inverter 5 converts a DC power received from the DC power source 2 into a three phase AC having a predetermined frequency, and outputs the three phase AC to the motor 3. The inverter 5 converts the AC power generated by the motor 3 into a DC power.

The inverter 5 includes six arms. Upper and lower arms of each phase include two arms connected in series between the positive electrode terminal and the negative electrode terminal of the smoothing capacitor 4. The upper and lower arms of each phase are made of a semiconductor device 10 described below. The inverter 5 is made of three semiconductor devices 10.

In the present embodiment, each of the arms has a MOSFET 6. Further, an n-channel type is adopted for the MOSFET 6. The MOSFET 6 has a drain electrode and a source electrode as main electrodes through which a main current flows. The drain electrode of the MOSFET 6 of the upper arm is electrically connected to the positive electrode terminal of the smoothing capacitor 4. The source electrode of the MOSFET 6 of the lower arm is electrically connected to the negative electrode terminal of the smoothing capacitor 4. The source electrode of the MOSFET 6 of the upper arm and the drain electrode of the MOSFET 6 of the lower arm are connected to each other.

The power conversion device 1 may include, in addition to the smoothing capacitor 4 and the inverter 5, a boost converter for boosting the DC voltage supplied from the DC power source 2, a drive circuit for driving elements that constitute the inverter 5 and the boost converter, a control circuit for outputting a drive command to the drive circuit, and the like.

(Configuration of Semiconductor Device)

Figure 2:
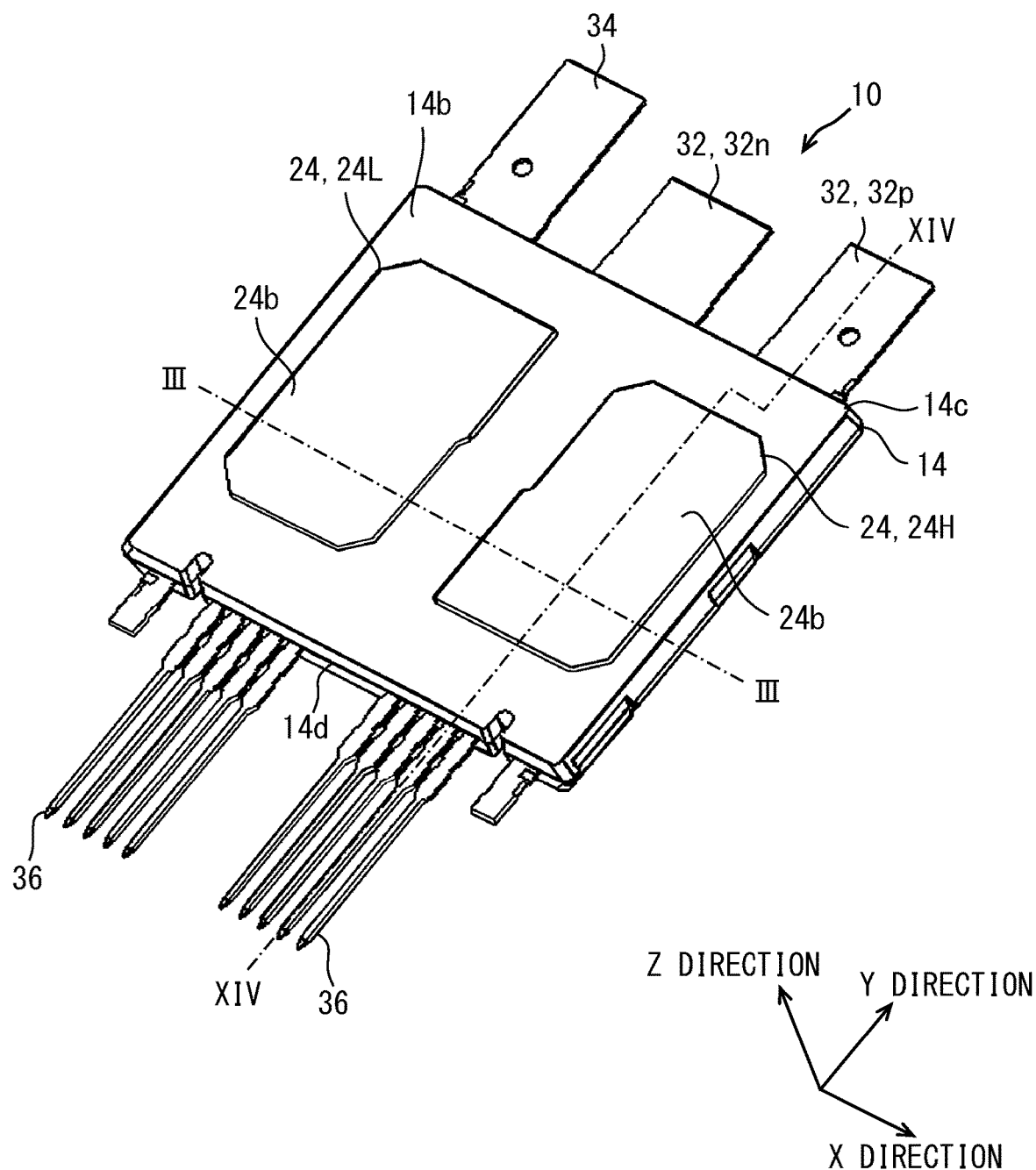
FIG. 2 is a perspective view of the semiconductor device.
Figure 3:
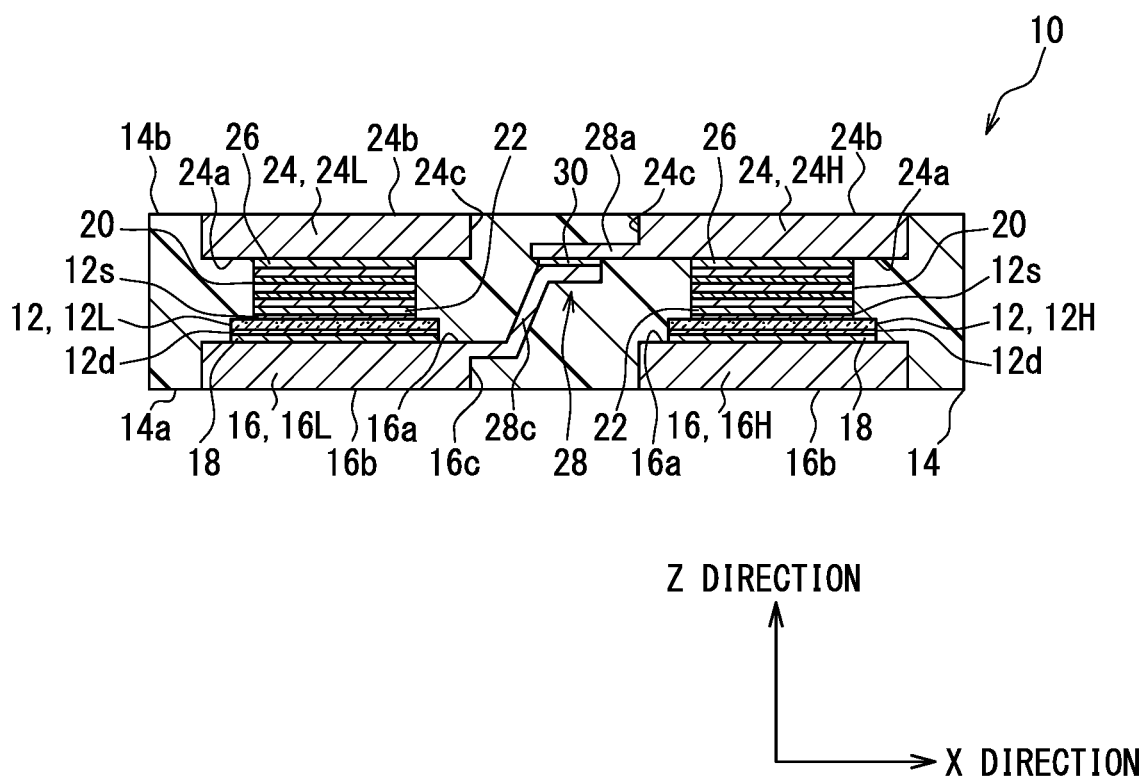
FIG. 3 is a cross sectional view taken along a line III-III in FIG. 2.
Figure 4:
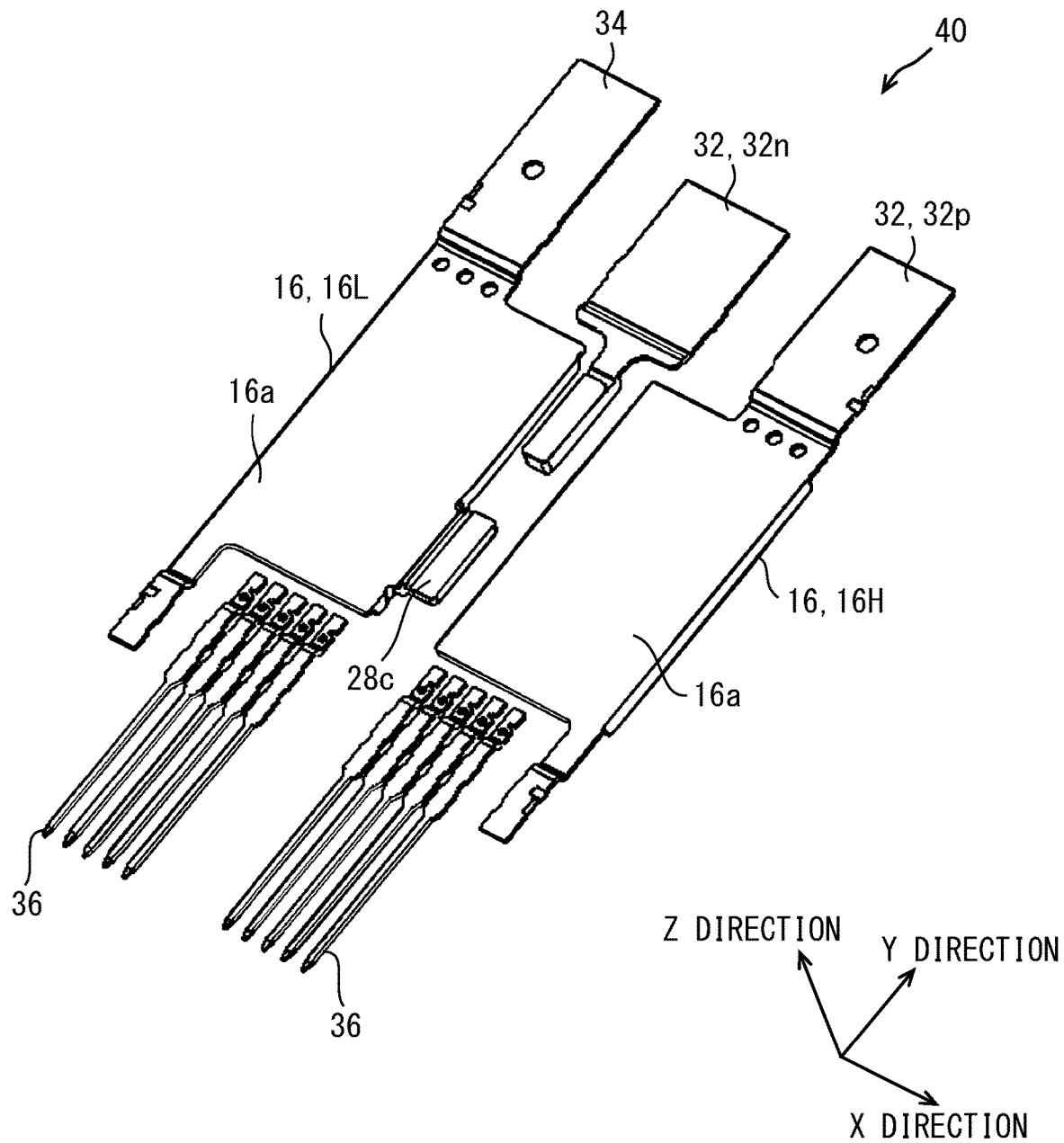
FIG. 4 is a perspective view of a lead frame including a first heat sink.
Figure 5:
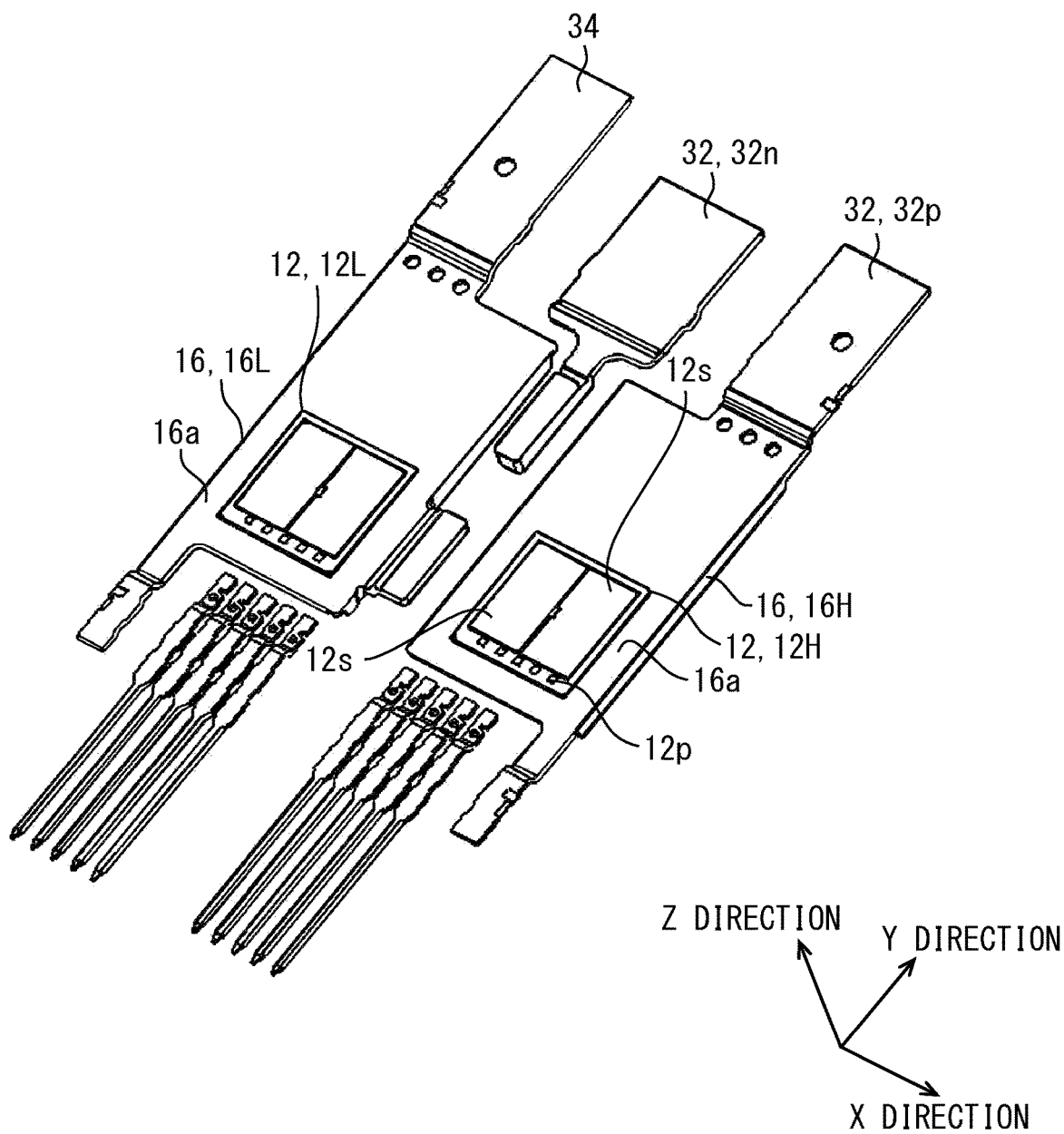
FIG. 5 is a perspective view of the lead frame on which a semiconductor chip is arranged.
Figure 6:
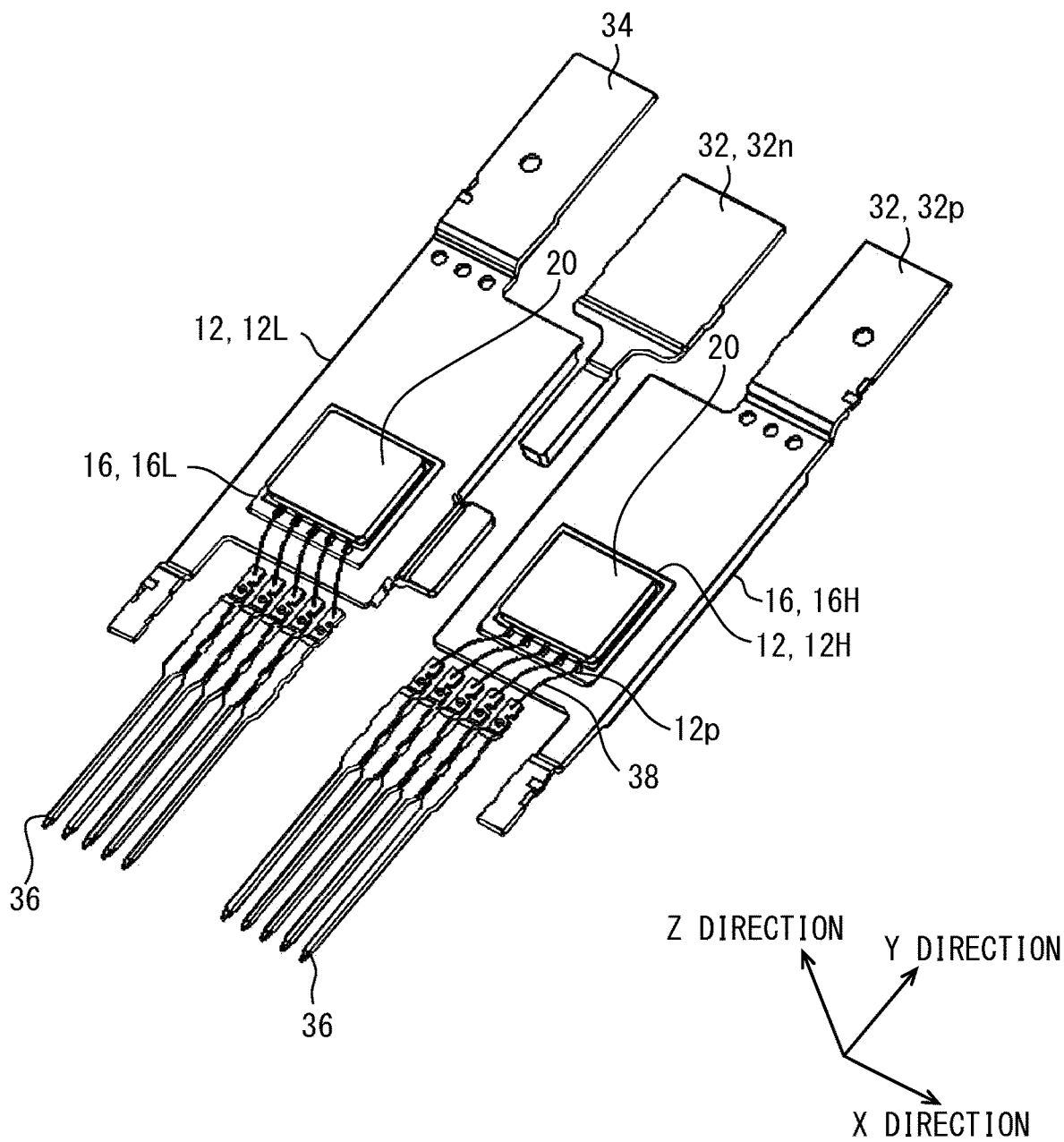
FIG. 6 is a perspective view of the lead frame on which a terminal member is arranged.
Figure 7:
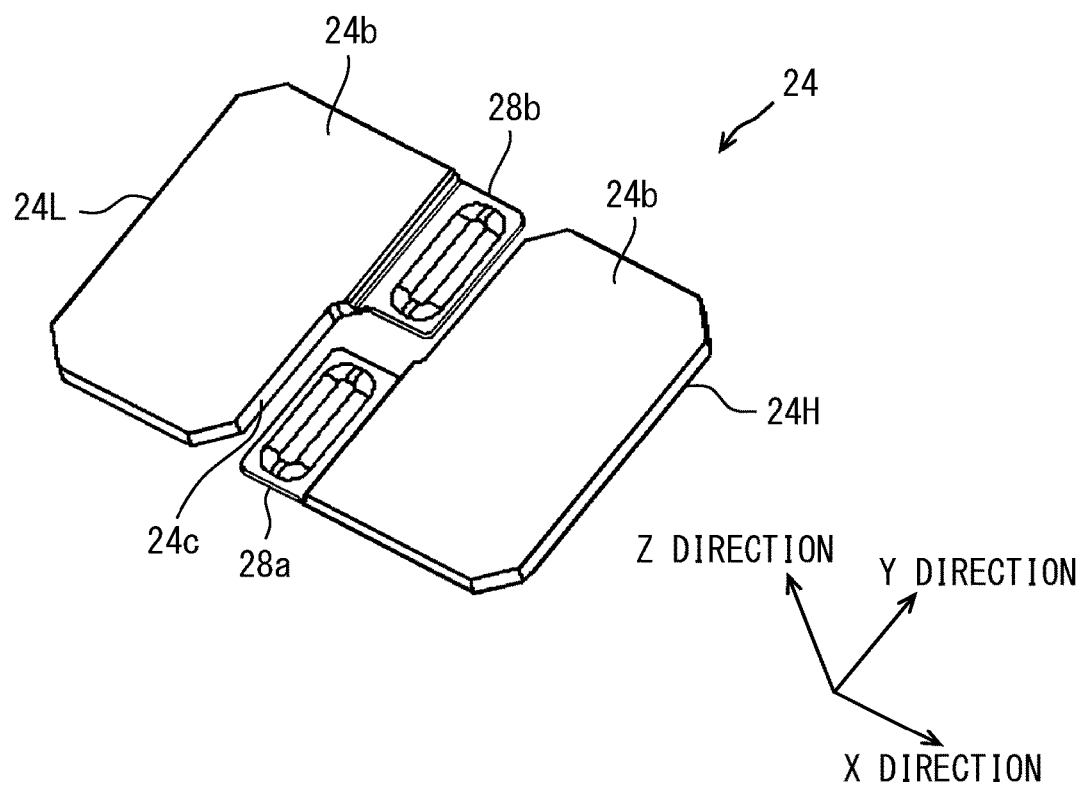
FIG. 7 is a perspective view of a second heat sink.
Figure 8:
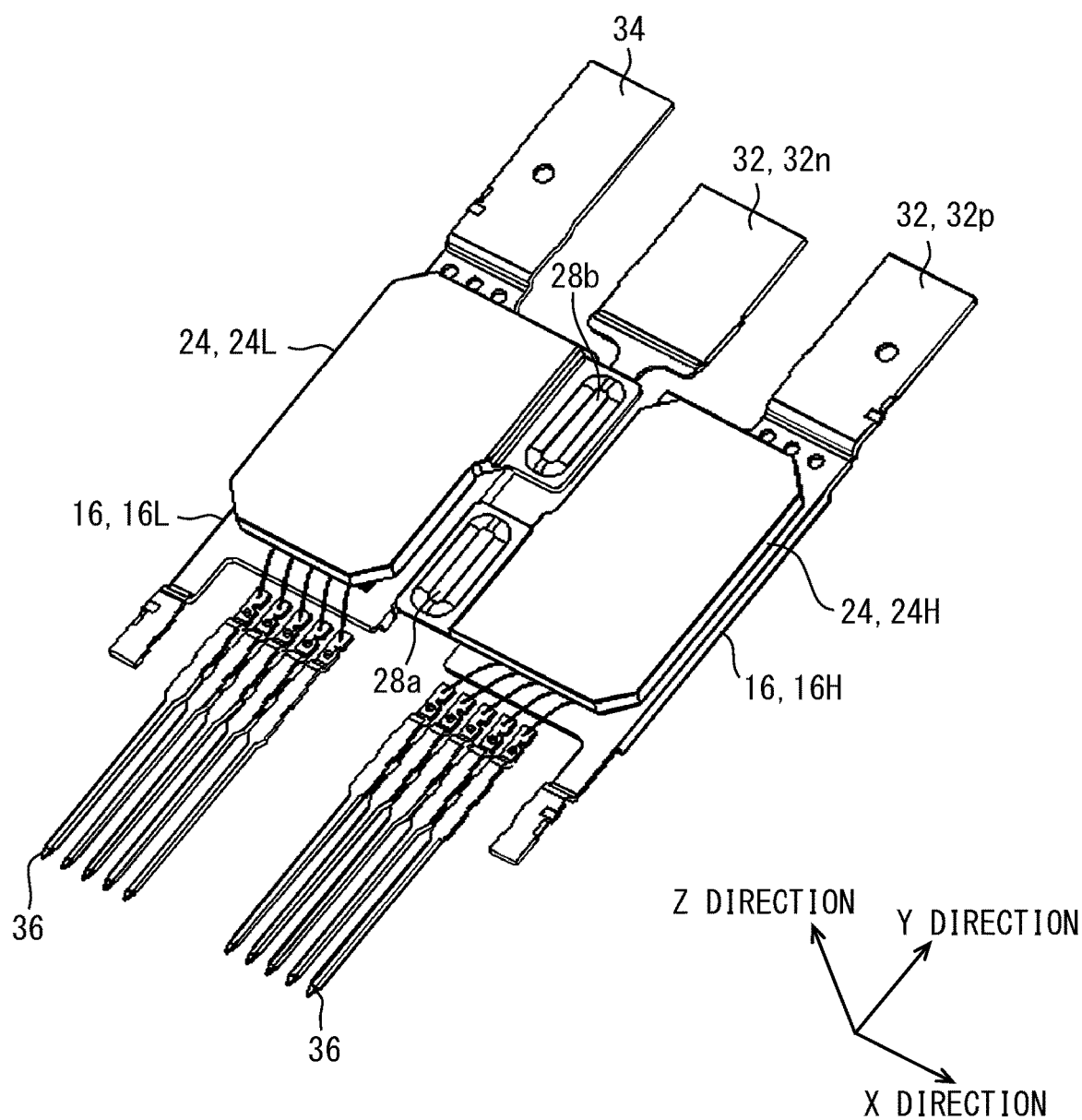
FIG. 8 is a perspective view of the lead frame in a state where the second heat sink is arranged on the terminal member.

As shown in FIGS. 2 to 8, the semiconductor device 10 includes a semiconductor chip 12, a sealing resin body 14, a first heat sink 16, a terminal member 20, a second heat sink 24, a joint part 28, a power supply terminal 32, an output terminal 34, and a signal terminal 36. FIG. 4 shows only a lead frame 40 including the first heat sink 16 among components of the semiconductor device 10. FIG. 5 shows a state in which the semiconductor chip 12 is connected to the structure shown in FIG. 4. FIG. 6 shows a state in which the terminal member 20 is connected to the structure shown in FIG. 5. FIG. 8 shows a state in which the second heat sink 24 is connected to the structure shown in FIG. 6.

The semiconductor chip 12 is provided by a SiC substrate formed with an element. Hereinafter, the semiconductor chip 12 on which the element of the upper arm is formed is also referred to as a semiconductor chip 12H, and the semiconductor chip 12 on which the element of the lower arm is formed is also referred to as a semiconductor chip 12L. The two semiconductor chips 12H, 12L are arranged so that plate thickness directions are the same direction (Z direction).

The element formed in the semiconductor chip 12 has a vertical structure so that a current flows in the Z direction. In the present embodiment, the n-channel type MOSFET is formed as the element as described above. As shown in FIG. 3, the drain electrode 12d is formed on one surface of the semiconductor chip 12 in the plate thickness direction, that is, in the Z-direction, and the source electrode 12s is formed on a rear surface opposite to the one surface. The drain electrode 12d corresponds to the main electrode on the one surface, and the source electrode 12s corresponds to the main electrode on the rear surface.

The semiconductor chips 12H, 12L have substantially the same planar shape, specifically, a substantially rectangular planar shape, and have substantially the same size and substantially the same thickness. The thickness of each of the semiconductor chips 12 is, for example, about 100 μm. The semiconductor chips 12H, 12L have the same configuration. The semiconductor chips 12H, 12L are disposed such that the drain electrodes 12d are on the same side in the Z direction and the source electrodes 12s are on the same side in the Z direction. The semiconductor chips 12H, 12L are positioned at substantially the same height in the Z direction and are aligned side by side in the X direction.

As shown in FIGS. 5 and 6, a pad 12p as signal electrode is formed on the rear surface of the semiconductor chips 12, that is, a source electrode forming surface. The pad 12p is formed at a position different from the source electrode 12s on the rear surface of the semiconductor chips 12. The pad 12p is formed at an end opposite to a region where the source electrode 12s is formed, in the Y direction.

In the present embodiment, the semiconductor chip 12 has five pads 12p. Specifically, the five pads 12p are provided for a gate electrode, a potential of the source electrode 12s, a current sense, an anode potential of a temperature sensor (temperature sensitive diode) for detecting the temperature of the semiconductor chips 12, and a cathode potential. The five pads 12p are collectively formed at the end in the Y direction and are aligned in the X direction, in the semiconductor chip 12 having the substantially rectangular planar shape.

The sealing resin body 14 seals the semiconductor chip 12. The sealing resin body 14 is made of, for example, an epoxy resin. The sealing resin body 14 is molded by, for example, a transfer molding method. As shown in FIGS. 2 and 3, the sealing resin body 14 has one surface 14a and a rear surface 14b opposite to the one surface 14a in the Z direction. The one surface 14a is a surface on the same side as the drain electrode 12d of the semiconductor chips 12, and the rear surface 14b is a surface on the same side as the source electrode 12s of the semiconductor chips 12. The one surface 14a and the rear surface 14b are, for example, flat surfaces. In the present embodiment, the sealing resin body 14 has a substantially rectangular shape in a plan view.

The first heat sink 16 is disposed adjacent to the one surface of the semiconductor chip 12, that is, the drain electrode 12d. The first heat sink 16 functions to dissipate heat of the corresponding semiconductor chip 12 to the outside of the semiconductor device 10, and also functions as wirings for the main electrode. For that reason, in order to have thermal conductivity and electrical conductivity, the first heat sink 16 is made of at least a metal material such as Cu or Al. In the present embodiment, the first heat sink 16 is made of Cu and has a thickness of about 2 mm. As shown in FIGS. 3 to 5, the first heat sink 16 includes a first heat sink 16H corresponding to the semiconductor chip 12H and a first heat sink 16L corresponding to the semiconductor chip 12L.

The first heat sink 16 is disposed so as to encompass the corresponding semiconductor chip 12 in a projection view in the Z direction. The first heat sink 16 is connected to the drain electrode 12d of the corresponding semiconductor chip 12 through a solder 18. Most part of the first heat sink 16 is covered with the sealing resin body 14. Among the surfaces of the first heat sink 16, a mounting surface 16a is connected to a solder 18. A heat dissipation surface 16b opposite to the mounting surface 16a is exposed from the sealing resin body 14. The heat dissipation surface 16b is substantially flush with the one surface 14a.

Specifically, the mounting surface 16a of the first heat sink 16H is connected to the drain electrode 12d of the semiconductor chip 12H through the solder 18. The mounting surface 16a of the first heat sink 16L is connected to the drain electrode 12d of the semiconductor chip 12L through the solder 18. The first heat sinks 16H, 16L are aligned side by side in the X direction and are arranged at substantially the same position in the Z direction. The heat dissipation surfaces 16b of the first heat sinks 16H, 16L are exposed from the one surface 14a of the sealing resin body 14 and aligned side by side in the X direction.

The terminal member 20 is interposed between the semiconductor chip 12 and the second heat sink 24, and electrically interconnect the semiconductor chip 12 and the second heat sink 24. Since the terminal member 20 is located in the middle of the thermal conduction path and electrical conduction path between the semiconductor chip 12 and the second heat sink 24, the terminal member 20 is made of at least a metal material in order to have thermal conductivity and electrical conductivity. The terminal member 20 is disposed to face the source electrode 12s of the corresponding semiconductor chip 12, and is connected to the source electrode 12s through a solder 22. The terminal member 20 is correspondingly provided for the semiconductor chip 12. That is, the semiconductor device 10 includes two terminal members 20. One of the two terminal members 20 is interposed between the semiconductor chip 12H and the second heat sink 24H, and the other is interposed between the semiconductor chip 12L and the second heat sink 24L. Details of the terminal member 20 will be described below.

The second heat sink 24 functions to dissipate heat of the corresponding semiconductor chip 12 to the outside of the semiconductor device 10, and also functions as wirings for the main electrode, similarly to the first heat sinks 16. The second heat sink 24 is disposed adjacent to the source electrode 12s of the semiconductor chip 12. The second heat sink 24 is arranged opposite to the first heat sink 16 with respect to the semiconductor chip 12 so that the semiconductor chip 12 is interposed between the second heat sink 24 and the first heat sink 16. The first heat sink 16 and the second heat sink 24 correspond to a pair of heat sinks. Hereinafter, the first heat sink 16 and the second heat sink 24 are also referred to as heat sinks 16, 24.

Figure 9:
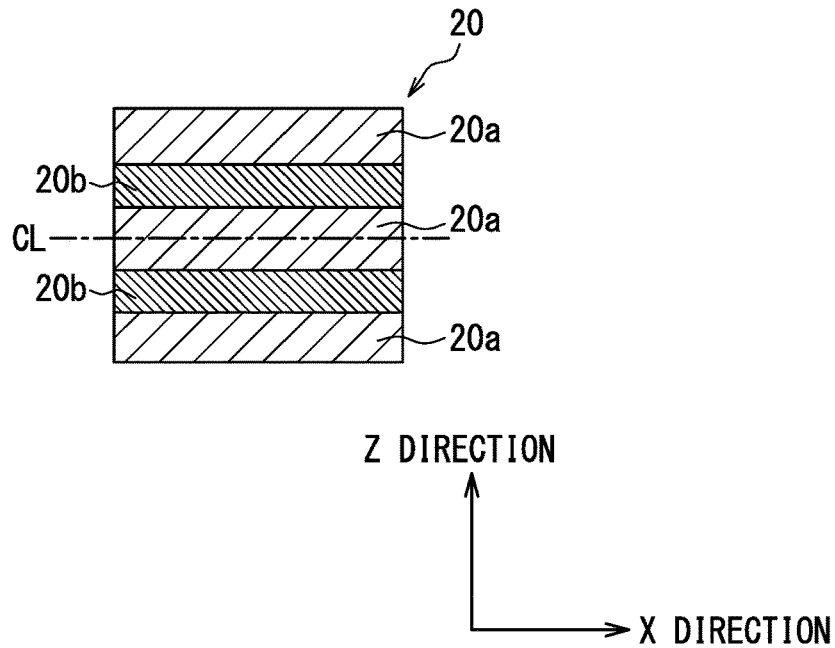
FIG. 9 is a cross sectional view for showing a detailed structure of the terminal member.

The second heat sink 24 is made of at least a metal material such as Cu or Al. In the present embodiment, the second heat sink 24 is made of Cu and have a thickness of about 2 mm. As shown in FIGS. 3, 7, and 9, the second heat sink 24 has a second heat sink 24H corresponding to the semiconductor chip 12H and a second heat sink 24L corresponding to the semiconductor chip 12L.

The second heat sink 24 is disposed so as to encompass the corresponding semiconductor chip 12 in a projection view in the Z direction. The second heat sink 24 is electrically connected to the source electrode 12s of the corresponding semiconductor chip 12. The second heat sink 24 is electrically connected to the corresponding source electrode 12s through the solder 22, the terminal member 20, and a solder 26. Most part of the second heat sink 24 is covered with the sealing resin body 14. Among the surfaces of the second heat sink 24, a mounting surface 24a is connected to the solder 26, and a heat dissipation surface 24b opposite to the mounting surface 24a is exposed from the sealing resin body 14. The heat dissipation surface 24b is substantially flush with the rear surface 14b. The solder 18, 22, and 26 correspond to bonding members.

Specifically, the mounting surface 24a of the second heat sink 24H is connected to the terminal member 20 corresponding to the semiconductor chip 12H through the solder 26. The mounting surface 24a of the second heat sink 24L is connected to the terminal member 20 corresponding to the semiconductor chip 12L through the solder 26. The second heat sinks 24H, 24L are aligned side by side in the X direction and are arranged at substantially the same position in the Z direction. The heat dissipation surfaces 24b of the second heat sinks 24H and 24L are exposed from the rear surface 14b of the sealing resin body 14 and aligned side by side in the X direction.

The joint part 28 has a first joint part 28a, a second joint part 28b, and a third joint part 28c. The first joint part 28a and the third joint part 28c electrically connect the second heat sink 24H of the upper arm and the first heat sink 16L of the lower arm. The second joint part 28b electrically connects the second heat sink 24L of the lower arm and a negative electrode terminal 32n.

In the present embodiment, the first joint part 28a is integrally formed with the second heat sink 24H by processing the same metal plate. The second joint part 28b is integrally formed with the second heat sink 24L by processing the same metal plate. The second heat sink 24H including the first joint part 28a and the second heat sink 24L including the second joint part 28b are common parts, and in the semiconductor device 10, these parts are arranged in two-fold rotational symmetry with respect to the Z axis as the rotation axis.

The first joint part 28a is formed thinner than the second heat sink 24H so as to be covered with the sealing resin body 14. The first joint part 28a connects to the second heat sink 24H so as to be substantially flush with the mounting surface 24a of the second heat sink 24H. The first joint part 28a extends in the X direction from a lateral surface 24c on the second heat sink 24L side of the second heat sink 24H. A surface of the first joint part 28a continuous with the mounting surface 24a of the second heat sink 24H is connected to the third joint part 28c through a solder 30.

The second joint part 28b has the same configuration as the first joint part 28a. A surface of the second joint part 28b continuous with the mounting surface 24a of the second heat sink 24L is connected to the negative electrode terminal 32n through the solder 30. Each of the surfaces of the first joint the part 28a and the second joint part 28b continuous with the corresponding mounting surface 24a has a groove for absorbing the overflowed solder 30. The groove has an annular shape.

The third joint part 28c is also integrally formed with the first heat sink 16L by processing the same metal plate. The third joint part 28c is formed thinner than the first heat sink 16L so as to be covered with the sealing resin body 14. The third joint part 28c connects to the first heat sink 16L so as to be substantially flush with the mounting surface 16a of the first heat sink 16L. The third joint part 28c extends from a lateral surface 16c on the first heat sink 16H side of the first heat sink 16L toward the second heat sink 24H.

The third joint part 28c is extended in the X direction in a plan view in the Z direction. In the present embodiment, the third joint part 28c has two bent portions, as shown in FIG. 3. The leading end of the third joint part 28c overlaps with the first joint part 28a in the projection view in the Z direction. Further, the third joint part 28c and the first joint part 28a are connected together through the solder 30. The third joint part 28c is aligned side by side with the second joint part 28b in the Y direction.

The first joint part 28a may be a member separate from the second heat sink 24H and be connected to the second heat sink 24H so as to continue to the second heat sink 24H. The second joint part 28b may be a member separate from the second heat sink 24L and be connected to the second heat sink 24L so as to continue to the second heat sink 24L. The third joint part 28c may be a member separate from the first heat sink 16L and be connected to the first heat sink 16L so as to continue to the first heat sink 16L. The upper arm and the lower arm may also be electrically connected by only one of the first joint part 28a and the third joint part 28c.

The power supply terminal 32 includes a positive electrode terminal 32p and a negative electrode terminal 32n. The positive electrode terminal 32p is electrically connected to the positive electrode terminal of the smoothing capacitor 4. The positive electrode terminal 32p is a main terminal through which a main current flows. The positive electrode terminal 32p is also referred to as a high potential power supply terminal or a P terminal. As shown in FIG. 4, the positive electrode terminal 32p connects to the first heat sink 16H, and extends in the Y direction from a surface of the first heat sink 16H opposite to a lateral surface adjacent to the signal terminals 36.

In the present embodiment, the positive electrode terminal 32p is integrally formed with the first heat sink 16H by processing the same metal plate. The positive electrode terminal 32p connects to one end of the first heat sink 16H in the Y direction. The positive electrode terminal 32p extends in the Y direction, and projects outside from a lateral surface 14c of the sealing resin body 14.

The negative electrode terminal 32n is electrically connected to the negative electrode terminal of the smoothing capacitor 4. The negative electrode terminal 32n is a main terminal through which the main current flows. The negative electrode terminal 32n is also referred to as a low potential power supply terminal or an N terminal. The negative electrode terminal 32n is disposed so that a part of the negative electrode terminal 32n overlaps the second joint part 28b in the projection view in the Z direction. The negative electrode terminal 32n is disposed closer to the semiconductor chip 12 than the second joint part 28b in the Z direction. The negative electrode terminal 32n and the second joint part 28b are connected together through the solder 30. The negative electrode terminal 32n extends in the Y direction, and projects outside of the sealing resin body 14 from the same lateral surface 14c as the positive electrode terminal 32p.

The output terminal 34 is electrically connected to the connection point between the upper arm and the lower arm. The output terminal 34 is electrically connected to the coil (stator winding) of the corresponding phase of the motor 3. The output terminal 34 is also referred to as an AC terminal or an O terminal. As shown in FIG. 4, the output terminal 34 connects to the first heat sink 16L, and extends on the same side as the positive electrode terminal 32p in the Y direction from a surface of the first heat sink 16L opposite to a lateral surface adjacent to the signal terminal 36.

In the present embodiment, the output terminal 34 is integrally formed with the first heat sink 16L by processing the same metal plate. The output terminal 34 connects to one end of the first heat sink 16L in the Y direction. The output terminal 34 extends in the Y direction, and projects outside of the sealing resin body 14 from the same lateral surface 14c as the positive electrode terminal 32p and the negative electrode terminal 32n.

The respective projecting portions of the positive electrode terminal 32p, the negative electrode terminal 32n, and the output terminal 34 from the sealing resin body 14 are arranged at substantially the same position in the Z direction. Further, the positive electrode terminal 32p, the negative electrode terminal 32n, and the output terminal 34 are aligned side by side in this order in the X direction. Thus, the negative electrode terminal 32n is disposed adjacent to the positive electrode terminal 32p.

The power supply terminal 32 and the output terminal 34 are also referred to as main terminals because the main current flows through them. The power supply terminal 32 and the output terminal 34 are connected to bus bars (not shown). The bus bars are connected to the corresponding power supply terminal 32 and output terminal 34, for example, by laser welding. In the present embodiment, in consideration of connectivity with the bus bar or the like, an extension length of the projecting portion from the sealing resin body 14 is different between the three of the power supply terminals 32 and the output terminal 34. The output terminal 34 is the longest, and the negative electrode terminal 32n is the shortest. Further, in regard to the width of the projecting portion, the positive electrode terminal 32p is the largest, and the output terminal 34 is the smallest.

The positive electrode terminal 32p may be a member separate from the first heat sink 16H and be connected to the first heat sink 16H so as to continue to the first heat sink 16H. The negative electrode terminal 32n may be made of the same metal plate as the second joint part 28b and furthermore the second heat sink 24L. The output terminal 34 may be a member separate from the first heat sink 16L and be connected to the first heat sink 16L so as to continue to the first heat sink 16L.

As shown in FIG. 6, the signal terminal 36 is electrically connected to the pad 12p of the corresponding semiconductor chip 12 through a bonding wire 38. The signal terminal 36 extends in the Y direction, and, as shown in FIG. 2, projects outside of the sealing resin body 14 from a lateral surface 14d opposite to the lateral surface 14c of the sealing resin body 14.

As shown in FIG. 4, in the present embodiment, the first heat sink 16, the third joint part 28c, the power supply terminal 32, the output terminal 34, and the signal terminal 36 are provided by the lead frame 40 which is the same metal plate. In the lead frame 40, the first heat sinks 16 and a connection portion of the negative electrode terminal 32 with the second joint part 28b are thick parts, and the other portion is a thin part thinner than the thick parts.

In the semiconductor device 10 configured as described above, the semiconductor chip 12, a part of each of the first heat sinks 16, the terminal member 20, a part of each of the second heat sinks 24, a part of each of the power supply terminals 32, a part of the output terminal 34, and a part of the signal terminal 36 are integrally sealed by the sealing resin body 14. In the semiconductor device 10, the two semiconductor chips 12 constituting the upper and lower arms for one phase are sealed by the sealing resin body 14. Therefore, the semiconductor device 10 is also referred to as a 2 in 1 package.

The heat dissipation surfaces 16b of the first heat sinks 16H, 16L are located in the same plane and substantially flush with the one surface 14a of the sealing resin body 14. Likewise, the heat dissipation surfaces 24b of the second heat sinks 24H, 24L are located in the same plane and substantially flush with the rear surface 14b of the sealing resin body 14. In this manner, the semiconductor device 10 forms a double sided heat dissipation structure in which the heat dissipation surfaces 16b, 24b are both exposed from the sealing resin body 14.

(Method for Manufacturing Semiconductor Device)

An example of a method for manufacturing the above described semiconductor device 10 will be described with reference to FIGS. 2, 4 to 6, and 8. FIGS. 2, 4 to 6, and 8 show the lead frame 40 in a product state. The lead frame 40 has outer frames and tie bars (not shown) until unnecessary portions are removed in the following manufacturing process.

First, each element constituting the semiconductor device 10 is prepared. For example, the lead frame 40 shown in FIG. 4 is prepared. Further, the semiconductor chip 12, the terminal member 20, and the second heat sink 24 are prepared respectively.

Next, as shown in FIG. 5, the semiconductor chips 12H, 12L are arranged on the mounting surface 16a of the corresponding first heat sinks 16H, 16L in the lead frame 40 through the solder 18. At that time, the semiconductor chips 12H, 12L are each arranged so that the drain electrode 12d is opposed to the mounting surface 16a.

Next, for example, the terminal member 20 in which the solders 22, 26 are preliminarily arranged as pick up solder on both surfaces, is arranged so that the solder 22 is adjacent to the semiconductor chip 12. The solder 26 is provided with the amount capable of absorbing the height variation in the semiconductor device 10. Further, the solder 30 is arranged on the third joint part 28c and the negative electrode terminal 32n.

Then, in this stacked state, a first reflow of the solders is performed. As a result, the drain electrode 12d of the semiconductor chip 12 and the corresponding first heat sink 16 are connected through the solder 18. Further, the source electrode 12s of the semiconductor chip 12 and the corresponding terminal member 20 are connected through the solder 22. That is, as shown in FIG. 6, a connection body in which the lead frame 40, the semiconductor chip 12, and the terminal member 20 are integrated can be obtained. After the first reflow, the pad 12p of the semiconductor chip 12 and the signal terminal 36 are connected by the bonding wire 38.

Next, the second heat sink 24 is arranged on a base (not shown) with the mounting surface 24a facing up. Then, the connection body is arranged on the second heat sink 24 so that the terminal member 20 is opposed to the second heat sink 24, and a second reflow of the solders is performed. In the second reflow, a load is applied from the side of the first heat sink 16 so that the height of the semiconductor device 10 becomes a predetermined height. FIG. 8 shows a state after the second reflow.

Next, molding of the sealing resin body 14 is carried out by the transfer molding method. In the present embodiment, the sealing resin body 14 is formed such that the first heat sink 16 and the second heat sink 24 are sealed completely. Before molding, a polyamide resin can be applied to surface portions of the first heat sink 16, the semiconductor chip 12, the terminal member 20, and the like that are in contact with the sealing resin body 14, to improve adhesion to the sealing resin body 14.

Next, the sealing resin body 14 molded is cut along with a part of the first heat sink 16 to expose the heat dissipation surface 16b of the first heat sink 16. As a result, the heat dissipation surface 16b is substantially flush with the one surface 14a. Likewise, the sealing resin body 14 molded is cut along with a part of the second heat sink 24 to expose the heat dissipation surface 24b of the second heat sink 24. As a result, the heat dissipation surface 24b is substantially flush with the rear surface 14b.

The sealing resin body 14 may be molded in a state in which the heat dissipation surfaces 16b, 24b are pressed against a cavity wall surface of a molding die to be in close contact with the cavity wall surface. In this case, the heat dissipation surfaces 16b, 24b are exposed from the sealing resin body 14 when the sealing resin body 14 is molded. Thus, the cutting after the molding is not necessary.

Next, unnecessary portions of the lead frame 40 such as outer frames and tie bars are removed. As a result, the semiconductor device 10 shown in FIG. 2 can be obtained.

(Details of Terminal Member)

The terminal member 20 is made up of a plurality of types of metal layers that are stacked. Metal layers adjacent to each other in the stacking direction are bonded together. In this case, "different types" may include metal layers made of different constituent metals or metal layers having different coefficients of linear expansion from each other. For example, even if the coefficients of linear expansion are the same, different metals provide different types. The plurality of types of metal layers may have the different coefficients of linear expansion from each other in the Z direction and at least one direction orthogonal to the Z direction, and each of the coefficients of linear expansion may be within a range from that of the semiconductor chip 12 at least to that of the second heat sink 24 at most. The coefficient of linear expansion as a whole of the terminal member 20 can be easily adjusted between that of the semiconductor chip 12 and that of the second heat sink 24. The direction orthogonal to the Z direction includes directions along the XY plane, that is, the X direction and the Y direction. The coefficient of linear expansion of SiC is about $4 \times 10^{-6}$/K, and the coefficient of linear expansion of Cu is about $17 \times 10^{-6}$/K.

In the present embodiment, a clad member including a metal layer made of a first metal and an alloy layer containing the first metal is employed as the terminal member 20. Specifically, as shown in FIG. 9, the clad member including a Cu layer 20a and an alloy layer 20b containing Cu is employed. Since the clad member is formed by molecular diffusion without using a bonding material, the connection reliability between the layers can be improved as compared with a conventional layered type. In the present embodiment, since all the layers contain the same metal (Cu), the connection reliability can improve. Furthermore, the reduction of the heat dissipation can be suppressed as compared with a configuration in which all the layers of the terminal member are made of the alloy layer.

Although the Cu layer 20a has excellent heat dissipation and thermal conductivity, the coefficient of linear expansion of the Cu layer 20a is larger than that of SiC. The coefficient of linear expansion of the Cu layer 20a is the same as that of the second heat sink 24. The alloy layer 20b contains Cu and a metal material having a coefficient of linear expansion smaller than that of the Cu. The coefficient of linear expansion of the alloy layer 20b at least in a direction orthogonal to the Z direction is smaller than that of Cu. In the present embodiment, the alloy layer 20b contains Cr. By using Cr, the coefficient of linear expansion of the alloy layer 20b can be reduced, and the lightweight terminal member 20 can be made at a low cost.

The alloy layer 20b containing Cr is formed by rolling, for example, Cr impregnated with Cu. In the rolling, the coefficient of linear expansion in a rolling direction and the coefficient of linear expansion in a direction orthogonal to the rolling direction with respect to a rolling reduction ratio behave differently from each other. This is because when the thermal expansion of Cu is restricted to Cr that is flat in the rolling direction, the stress works differently in the rolling and orthogonal directions. The rolling reduction ratio is a reduction ratio of the thickness of a rolled material.

In the rolling direction, the coefficient of linear expansion continues to decrease as the rolling reduction ratio increases. For example, in a 50 mass % Cr—Cu rolled material, the coefficient of linear expansion becomes almost constant at the rolling reduction ratio of about 70%. Similarly to the rolling direction, in the orthogonal direction, the coefficient of linear expansion continues to decrease as the rolling reduction ratio increases, but the amount of decrease with respect to the rolling reduction ratio is smaller than that in the rolling direction. For example, even when the 50 mass % Cr—Cu rolled material is rolled to the rolling reduction ratio of 98%, the coefficient of linear expansion continues to decrease, and approaches the coefficient of linear expansion of the rolling direction.

In the present embodiment, the terminal member 20 is made of the clad member using the Cr—Cu rolled material in which the coefficient of linear expansion in the rolling direction, which greatly contributes to the generation of thermal stress in a bonding portion, is almost constant with respect to the rolling reduction ratio. The Cy-Cu rolled material is, for example, a 50 mass % Cr—Cu rolled material that has been rolled to the rolling reduction ratio of 70% or more. In the alloy layer 20b (Cr—Cu rolled material), the X direction and the Y direction are the rolling directions, so that the coefficients of linear expansion in the directions orthogonal to the Z direction, that is, the X direction and the Y direction, are the same. The coefficient of linear expansion in the Z direction of the alloy layer 20b is larger than those in the X direction and the Y direction of the alloy layer 20b, and smaller than that of Cu in the present embodiment.

In the terminal member 20, the thermal expansion of the Cu layer 20a is restricted by the alloy layer 20b, and the suppression effect of the coefficient of linear expansion is higher than that of a material in which Cu and Cr—Cu alloy powders are simply compounded. With such a layered structure, the coefficient of linear expansion in the direction orthogonal to the Z direction of the terminal member 20 as a whole has a value between the value of the semiconductor chip 12 and the value of the second heat sink 24, and is, for example, about $12 \times 10^{-6}$/K to $13 \times 10^{-6}$/K. Therefore, the thermal stress acting on the solder 22 connecting the semiconductor chip 12 to the terminal member 20 can be reduced.

Further, the thermal diffusion effect can be enhanced by the Cu layer 20a while keeping the coefficient of linear expansion small. Therefore, the thermal stress acting on the solders 18, 22 can be reduced without impairing the heat dissipation of the semiconductor device 10. In particular, since the alloy layer 20b is thinner than the Cu layer 20a, the heat dissipation effect can be enhanced while using the alloy layer 20b.

In addition, the Cu layer 20a and the alloy layer 20b are symmetrically arranged in the Z direction. Specifically, as shown in FIG. 9, the Cu layers 20a and the alloy layers 20b are arranged in line symmetry with respect to the center line CL of the terminal member 20 in the Z direction. The Cu layers 20a and the alloy layers 20b are alternately arranged so that the number of layers is an odd number 5. The Cu layers 20a have substantially the same thickness to each other, and the alloy layers 20b have substantially the same thickness to each other.

Since the symmetry in the Z direction is high, it is less likely that the terminal member 20 will be warped due to the difference in the coefficients of linear expansion of the metal layers constituting the terminal member 20. That is, the stress acting on the solders 18, 22, and 26 can be reduced. The terminal member 20 has a substantially rectangular shape in a plan view, and the shapes of the Cu layer 20a and the alloy layer 20b are substantially the same in a projection view in the Z direction. Therefore, the terminal member 20 has high symmetry even in the direction orthogonal to the Z direction, so that the warpage can be suppressed.

Further, the Cu layer 20a, the alloy layer 20b, the Cu layer 20a, the alloy layer 20b, and the Cu layer 20a are layered in this order. Thus, the Cu layer 20a having higher wettability than the alloy layer 20b is disposed in a surface layer of the terminal member 20. The alloy layer 20b having lower wettability than the Cu layer 20a appears on a lateral surface of the terminal member 20. As a result, the solders 22, 26 can be restricted from creeping up to the lateral surface of the terminal member 20 while securing the bondability with the solders 22, 26.

(Effects of Semiconductor Device)

In the present embodiment, in the semiconductor device 10 having a double sided heat dissipation structure, SiC (silicon carbide) is used for the semiconductor chip 12. SiC has characteristics such as a larger dielectric breakdown field and band gap, a higher thermal conductivity, and a faster electron saturation velocity than Si. However, SiC has Young's modulus about three times larger than that of Si.

On the other hand, in the present embodiment, the terminal member 20 is made up of a plurality of types of metal layers that are layered. In the terminal member 20 as a whole, the value of the coefficient of linear expansion in the direction orthogonal to the Z direction is between that of the semiconductor chip 12 and that of the second heat sink 24. Therefore, the thermal stress acting on the solders 18, 22, 26 or the semiconductor chip 12 can be reduced.

Further, the metal layers are symmetrically arranged in the Z direction. As a result, the warpage of the terminal member 20 can be suppressed, and the local stress can be suppressed from acting on the solders 18, 22, 26 or the semiconductor chip 12. As described above, the semiconductor device 10 of the present embodiment is suitable for a configuration in which SiC is used for the semiconductor chip 12.

In the present embodiment, the terminal member 20 uses the clad member in which the Cu layer 20a and the alloy layer 20b containing Cu are layered in sequence. In this case, the connection reliability between the layers can be improved as compared with a conventional layered-type terminal member in which layers are bonded using a bonding material. Further, since all the layers contain Cu, the connection reliability between the layers can be improved. Furthermore, the reduction of the heat dissipation can be suppressed. Thus, the temperature rise can be suppressed and the thermal stress can be reduced when the semiconductor device 10 is driven. In addition, thermal degradation of the components of the semiconductor device 10 can be suppressed. In particular, since the alloy layer 20b contains Cr, the coefficient of linear expansion of the terminal member 20 can be reduced, and the lightweight terminal member 20 can be made at a low cost.

In the present embodiment, the surface layer of the terminal member 20 is the Cu layer 20a. Thus, the connection reliability between the terminal member 20 and the solders 22, 26 can be improved. Further, since the alloy layer 20b having low wettability appears on the lateral surface of the terminal member 20, the solders 22, 26 can be restricted from creeping up to the lateral surface of the terminal member 20.

The configuration of the terminal member 20 is not limited to the above example. The arrangement of the Cu layer 20a and the alloy layer 20b containing Cr is not limited to the above example. For example, the number of layers is not limited to five. The number of layers of the terminal member 20 may be three or more. In the case of an odd number of layers, symmetry can be realized in the Z direction. Further, the terminal member 20 may have an even number of layers. For example, two clad members each having the Cu layer 20a, the alloy layer 20b, and the Cu layer 20a may be stacked, so that the terminal member 20 may have a six layer structure including the Cu layer 20a, the alloy layer 20b, the Cu layer 20a, the Cu layer 20a, the alloy layer 20b, and the Cu layer 20a in this order. Also in this case, the symmetry can be realized in the Z direction.

Figure 10:
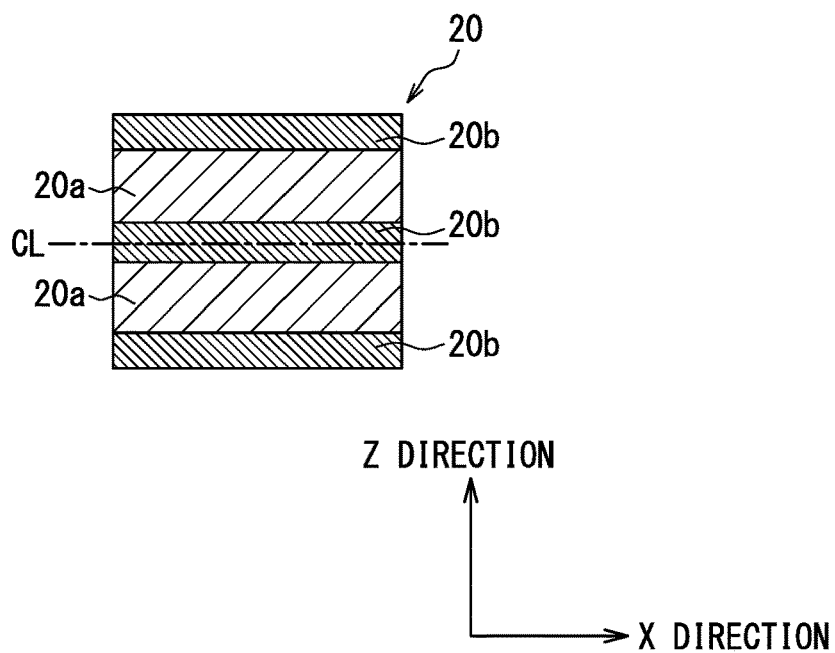
FIG. 10 is a cross sectional view showing a first modification and corresponding to FIG. 9.

For example, as in a first modification shown in FIG. 10, a configuration in which the alloy layer 20b is the surface layer may be employed. In FIG. 10, the alloy layer 20b, the Cu layer 20a, the alloy layer 20b, the Cu layer 20a, and the alloy layer 20b are stacked in this order. Since the coefficient of linear expansion of the alloy layer 20b is smaller than that of the Cu layer 20a, the heat transfer from the alloy layer 20b to the Cu layer 20a has a smaller barrier to thermal conduction than the heat transfer from the Cu layer 20a to the alloy layer 20b. In FIG. 10, while employing the five layer structure, the number of the alloy layers 20b is greater than that of the Cu layers 20a. Thus, the heat dissipation can be improved as compared with the configuration shown in FIG. 9.

Figure 11:
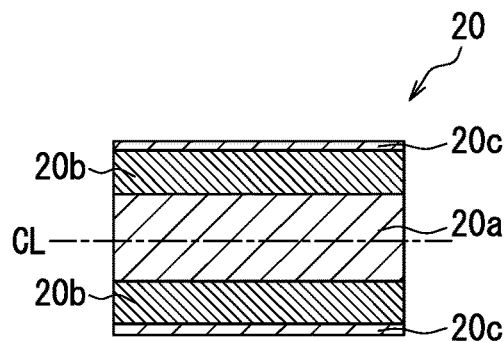
FIG. 11 is a cross sectional view showing a second modification and corresponding to FIG. 9.
Figure 11:
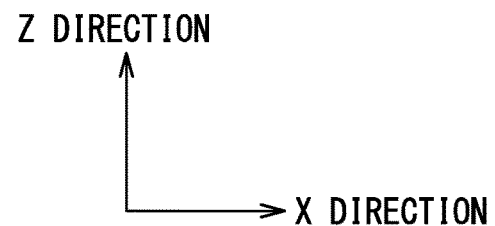

As in a second modification shown in FIG. 11, the thickness of a Cu layer 20c forming the surface layer may be thinner than that of the Cu layer 20a and the alloy layer 20b forming the inner layer. For example, the thickness of the Cu layer 20c may be about 30 μm, the thickness of the Cu layer 20a may be about 1 mm, and the thickness of each of the alloy layers 20b may be about 500 μm. The Cu layer 20a and the alloy layer 20b are provided to adjust the coefficient of linear expansion and the heat dissipation, and the Cu layer 20c is provided to improve the bondability.

Figure 12:
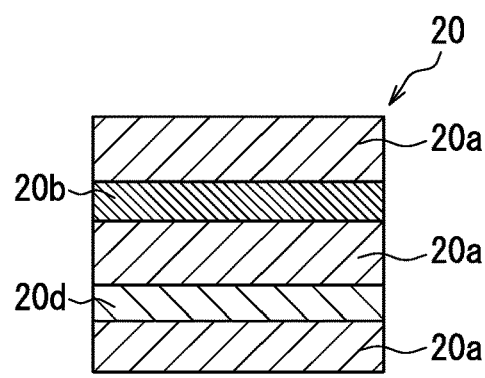
FIG. 12 is a cross sectional view showing a third modification and corresponding to FIG. 9.
Figure 12:
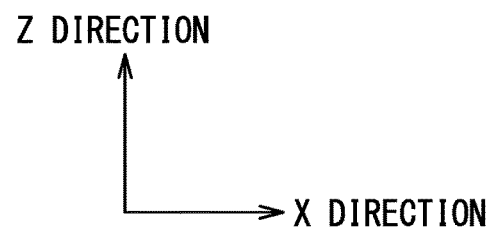

Instead of Cr, a metal material having a small coefficient of linear expansion, such as Mo, may be used. Further, instead of Cu, a material having excellent thermal conductivity, such as Al, may be used. For example, as in a third modification shown in FIG. 12, a clad member having the Cu layer 20a, the alloy layer 20b containing Cr, and an alloy layer 20d containing Mo (Mo—Cu alloy) may be used as the terminal member 20. In FIG. 12, the Cu layer 20a, the alloy layer 20b, the Cu layer 20a, the alloy layer 20d, and the Cu layer 20a are stacked in this order. Although the plurality of layers are not symmetrically arranged in the Z direction, the warpage of the terminal member 20 can be suppressed by bringing the coefficients of linear expansion of the alloy layers 20b, 20d close to each other, preferably substantially coincide. That is, the warpage of the terminal member 20 can be suppressed by making the coefficient of linear expansion symmetric in the Z direction.

Second Embodiment

The present embodiment can refer to the preceding embodiment. Therefore, the descriptions of the same parts as the semiconductor device 10 shown in the preceding embodiment will be omitted.

The source electrode 12s has a base layer containing Al as a main component, such as AlSi, and an upper layer formed on the base layer for the purpose of improving the bonding strength with the solder 22 and improving the wettability of the solder 22. The upper layer is formed using a Ni based material such as NiP. Ni is a metal material that is harder than Al. According to this structure, in a soldered state, the stress is concentrated in the base layer immediately under an end surface of the upper layer due to the stress generated in a power cycle or the like. In particular, in this embodiment, SiC having a large Young's modulus is used as the semiconductor chip 12.

On the other hand, in the present embodiment, a facing surface of the terminal member 20 facing the semiconductor chip 12 has a first portion having a good wettability to the solder 22 and a second portion having a lower wettability than the first portion. In the example shown in FIG. 13, the thin Cu layer 20c forming the surface layer adjacent to the semiconductor chip 12 has been partially removed by etching and is located only in the central region on the facing surface. The alloy layer 20b immediately under the Cu layer 20c is exposed in an outer peripheral region surrounding the Cu layer 20c.

Figure 13:
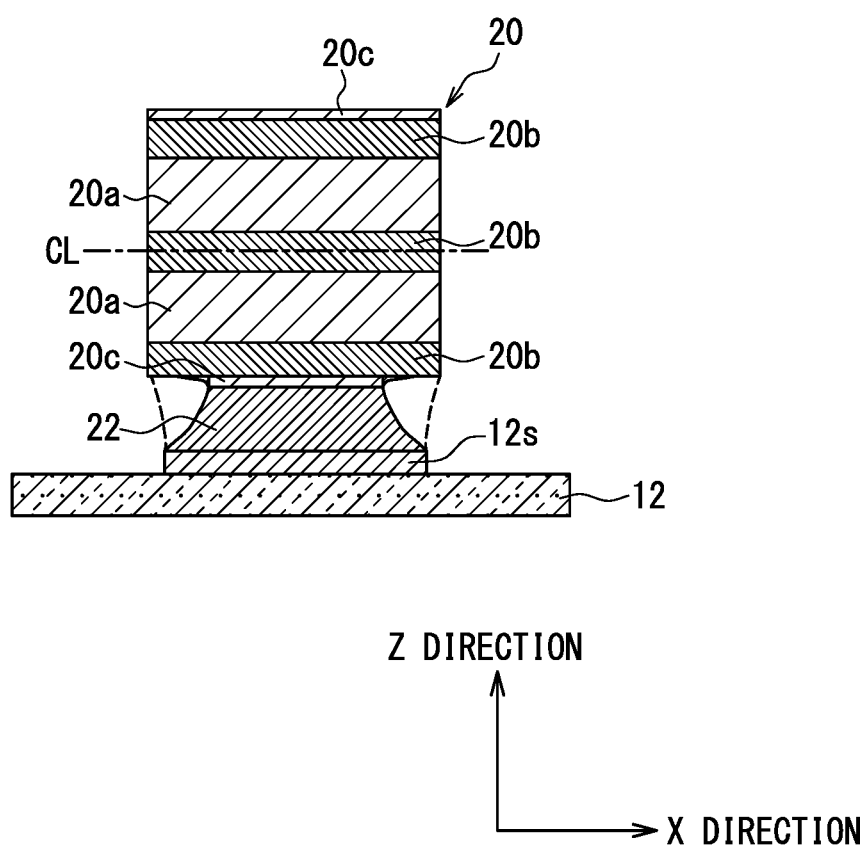
FIG. 13 is a cross sectional view of a periphery of the terminal member of a semiconductor device according to a second embodiment.

Since the wettability of the alloy layer 20b is lower than that of the Cu layers 20a, 20c, even if the solder 22 wets and spreads over the alloy layer 20b arranged in the outer peripheral region of the facing surface of the terminal member 20, a fillet is formed not to include the outer peripheral region. Therefore, an angle formed between the source electrode 12s and the solder 22, that is, the fillet angle can be made an acute angle. Thus, in the base layer, the stress concentrated in the portion immediately under the end surface of the upper layer can be reduced. Further, since the clad member is prepared and only a part of the surface layer is removed, the configuration can be simplified. A dashed line shown in FIG. 13 is a reference line showing the fillet when the Cu layer 20c is arranged on the entirety of the facing surface.

The configuration of the terminal member 20 is not limited to the above example. In the example shown in FIG. 13, the fillet angle is controlled by etching the Cu layer 20c so as to partially provide the low wettability portion on the facing surface of the terminal member 20 facing the semiconductor chip 12. However, a film having good wettability may be locally provided by sputtering or the like. Further, instead of the alloy layer 20b, the alloy layer 20d containing Mo may be exposed as the low wettability portion. In addition, the alloy layers 20b, 20d may be partially exposed on a surface of the terminal member 20 opposing the second heat sink 24, and may form the low wettability portion.

Third Embodiment

The present embodiment can refer to the preceding embodiments. Therefore, the descriptions of the same parts as the semiconductor device 10 shown in the preceding embodiments will be omitted.

Figure 14:
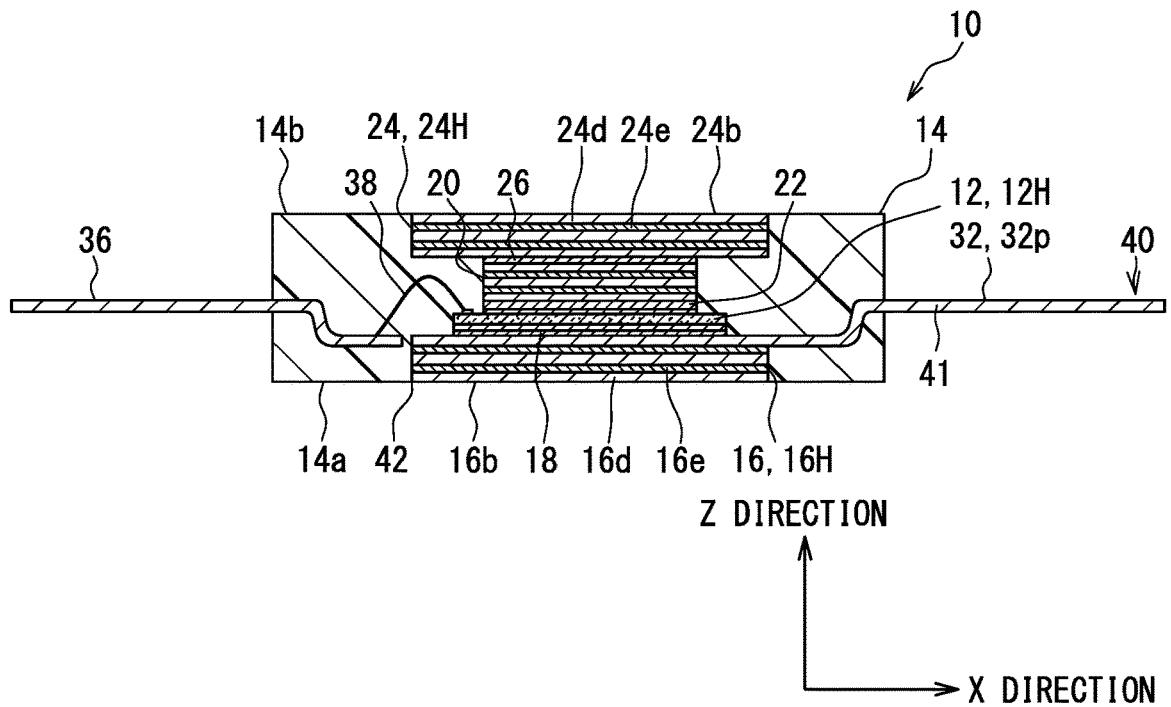
FIG. 14 is a cross sectional view of a semiconductor device according to a third embodiment, and corresponds to a line XIV-XIV in FIG. 2.

A clad member may be used for at least one of the heat sinks 16, 24. In the example shown in FIG. 14, the clad member is used for each of the first heat sink 16 and the second heat sink 24. The terminal member 20 has the similar structure to that of the first embodiment (see FIG. 9). FIG. 14 is a cross sectional view taken along a line XIV-XIV shown in FIG. 2.

The second heat sink 24H including the first joint part 28a (not shown) employs the clad member. The second heat sink 24H including the first joint part 28a is made up of three Cu layers 24d and two alloy layers 24e containing Cu and Cr that are alternately layered. As described above, the second heat sink 24H is configured similarly to the terminal member 20. The same applies to the second heat sink 24L.

In the lead frame 40, the positive electrode terminal 32p, the signal terminal 36, the negative electrode terminal 32n, the output terminal 34, the third joint part 28c (not shown), and a part of the first heat sink 16 are made of a base material 41 containing Cu. That is, the thin part of the lead frame 40 is made of the base material 41. The thick part of the lead frame 40 includes a clad member 42.

The clad member 42 is made up of Cu layers 16d and alloy layers 16e containing Cu and Cr that are alternately layered. The first heat sink 16 shown in FIG. 14 is formed by the base material 41 and the clad member 42. The first heat sink 16 including the base material 41 and the clad member 42 has a layered structure of three Cu layers 16d and two alloy layers 16e.

As described above, in the present embodiment, the second heat sink 24 is also made of the clad member. Thus, in the second heat sink 24, the coefficients of linear expansion in the directions orthogonal to the Z direction, that is, the X direction and the Y direction can be reduced while suppressing reduction in heat dissipation. In other words, the difference in the coefficient of linear expansion from the terminal member 20 can be reduced or substantially the same. Therefore, the thermal stress acting on the solder 26 between the second heat sink 24 and the terminal member 20 can be reduced. Further, since the Cu layer 24d provides the mounting surface 24a, the connectivity with the solders 26, 30 can be improved.

In the present embodiment, the first heat sink 16 is also made of the clad member. Thus, in the first heat sink 16, the coefficients of linear expansion in the directions orthogonal to the Z direction, that is, the X direction and the Y direction can be reduced while suppressing the reduction in heat dissipation. Therefore, the thermal stress acting on the solder 18 between the first heat sink 16 and the semiconductor chip 12 can be reduced.

In particular, in the present embodiment, the heat sinks 16, 24 both contain the clad member. In the direction orthogonal to the Z direction, the coefficient of linear expansion of the entire first heat sink 16 and the coefficient of linear expansion of the entire second heat sink 24 are substantially the same. Therefore, the warpage of the semiconductor device 10 can be suppressed. Further, since the base material 41 made of Cu is used, the connectivity with the solder 18, the bonding wire 38, the bus bar, and the like can be improved.

The application of the clad member to the heat sinks 16, 24 is not limited to the above example. Only the first heat sink 16 may include the clad member. Further, only the second heat sink 24 may include the clad member. However, as described above, it is preferable that the heat sinks 16, 24 both include the clad member.

The structure of the clad member may be different from that of the example shown in FIG. 14. The structure may be different from that of the terminal member 20.

For example, the lead frame 40 including the first heat sink 16 may be composed of only the clad member similarly to the second heat sink 24H. In this case, the positive electrode terminal 32p and the signal terminal 36 also have a layered structure of the Cu layer 16d and the alloy layer 16e. When the Cu layer 16d is the surface layer, the connectivity with the solder 18, the bonding wire 38, the bus bar, and the like can be improved.

The second heat sink 24 may have the same configuration as the lead frame 40 (first heat sink 16) described above. That is, the first joint part 28a may be made of the base material containing Cu, and the second heat sink 24 may be made of the base material and the clad member. Since the base material forms the mounting surface 24a, the connectivity with the solders 26 and 30 can be improved.

Figure 15:
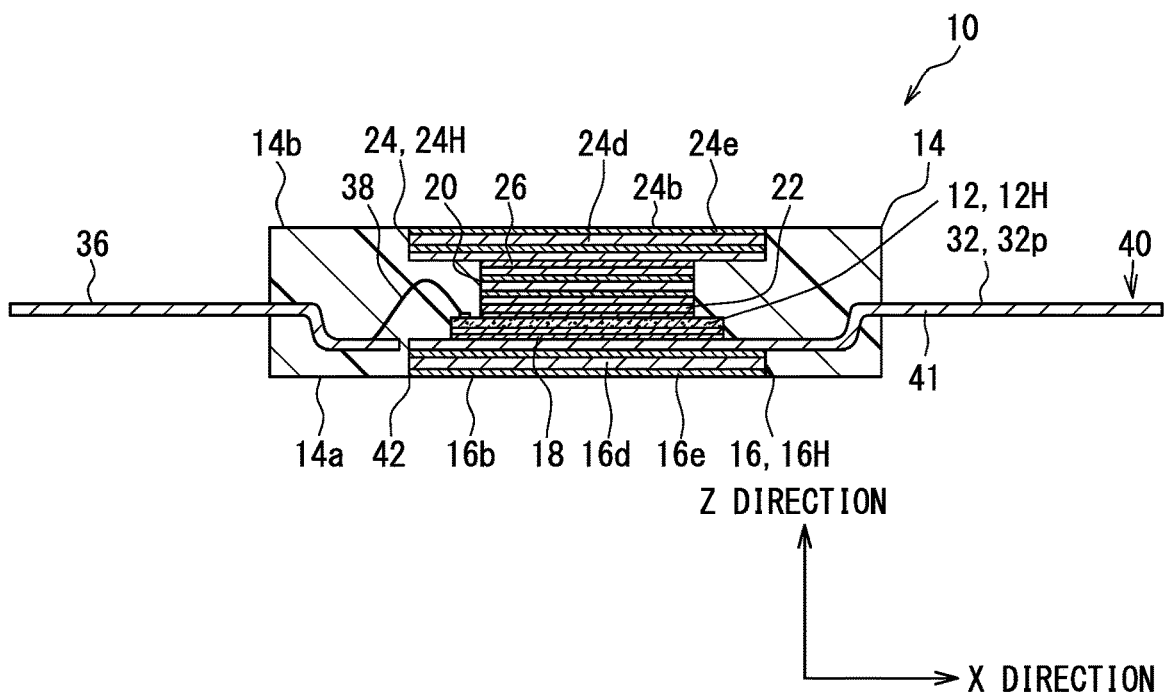
FIG. 15 is a cross sectional view showing a fourth modification.

As in a fourth modification shown in FIG. 15, the alloy layer 24e may form the heat dissipation surface 24b. Further, the alloy layer 16e may form the heat dissipation surface 16b. For example, by providing a cutting line in the middle of the alloy layer 24e, the alloy layer 24e forms the heat dissipation surface 24b. Further, by providing a cutting line in the middle of the alloy layer 16e, the alloy layer 16e forms the heat dissipation surface 16b. Since Cr is superior in machinability to Mo and Cu, by providing cutting lines in the alloy layers 16e, 24e containing Cr, the machinability in exposing the heat dissipation surfaces 16b, 24b can be improved.

Although not shown, the second heat sink 24 may be configured so that the alloy layer 24e forms the mounting surface 24a. For example, similarly to the terminal member 20 shown in FIG. 10, heat dissipation can be improved by increasing the number of the Cu layer 24d to be greater than the number of the alloy layer 24e. Although not shown, the same applies to the first heat sink 16. That is, the lead frame 40 including the clad member 42 may be configured so that the alloy layer 16e forms the mounting surface 16a of the first heat sink 16.

Instead of the alloy layers 16e, 24e containing Cr, an alloy layer containing Cu and Mo may be employed. As a result, the coefficient of linear expansion of the heat sinks 16, 24 can be reduced.

The heat sinks 16, 24 may be made of only the clad member, and regions connecting to the heat sinks 16, 24, such as the positive electrode terminal 32p and the first joint part 28a, may be made of a thin plate containing Cu. In this case, the thin plate and the clad member may be connected by diffusion bonding, laser welding, crimping, or the like.

In a configuration in which the clad member is not used for the terminal member 20, for example, the terminal member 20 is made of Cu, the clad member may be used for the second heat sink 24. In this case, the machinability can also be improved by using the alloy layer 24e as the heat dissipation surface 24b.

In a configuration in which the clad member is not used for the terminal member 20 and the second heat sink 24, the clad member may be used for the first heat sink 16. The difference in the coefficient of linear expansion from the terminal member 20 can be reduced, and the thermal stress acting on the solder 18 between the semiconductor chip 12 and the first heat sink 16 can be reduced. Further, when the alloy layer 16e forms the heat dissipation surface 16b, the machinability can be improved.

Fourth Embodiment

The present embodiment can refer to the preceding embodiments. Therefore, the descriptions of the same parts as the semiconductor device 10 shown in the preceding embodiments will be omitted.

In the present embodiment, a lead free solder specified below is used as at least one of the solders 18, 22, and 26. The lead free solder can be combined with any of the preceding embodiments and modifications.

The lead free solder contains 3.2 to 3.8 mass % Ag, 0.6 to 0.8 mass % Cu, 0.01 to 0.2 mass % Ni, and further contains Sb and Bi.

The addition of Ag achieves the effect of improving the wettability of the solder and strengthening the precipitation dispersion. On the other hand, the liquidus temperature rises. Considering a heat resistance of the semiconductor chip 12 (SiC), it is preferable to keep the temperature to 300 degrees Celsius or less during soldering. Therefore, the content of Ag is set to 3.2 to 3.8 mass % in order to keep the liquidus temperature to 270 degrees Celsius or less in consideration of variation while sufficiently obtaining the effects of improved wettability and precipitation dispersion.

The addition of Cu achieves the effect of preventing the dissolution of Cu in Cu lands and strengthening the matrix by depositing the fine intermetallic compound $Cu_6Sn_5$ in the solder matrix. Excessive addition of Cu causes intermetallic compounds to precipitate at the bonding interface, accelerating propagation of a crack. Therefore, the content of Cu is set to 0.6 to 0.8 mass %.

The addition of Ni achieves the effect of strengthening the bonding interface by refining the intermetallic compound that precipitates at the bonding interface. On the other hand, the liquidus temperature rises. Therefore, the content of Ni is set to 0.01 to 0.2 mass % in order to keep the liquidus temperature to 270 degrees Celsius or less while sufficiently obtaining the effect of strengthening the bonding interface.

The addition of Sb achieves the effect of strengthening solid solution precipitation and strengthening precipitation dispersion, and the substitution of Sb with respect to Sn causes lattice strain, which has the effect of strengthening the Sn matrix. Bi having an atomic radius larger than that of Sb exhibits an effect equal to Sb or more in strengthening the Sn matrix. On the other hand, the excessive amounts of Sb or Bi causes a decrease in wettability and processability into foil.

The creep resistance is increased by the effect of strengthening the Sn matrix with the addition of Sb and Bi. That is, the creep can be suppressed low.

Further, when the semiconductor device 10 is manufactured, the solidus temperature is preferably 200 degrees Celsius or more in order to maintain the connection reliability of the solder in the molding process or the like after soldering. The amounts of Sb and Bi added are adjusted in consideration of the effects described above.

The lead free solder that satisfies the above requirements can not only increase the lifetime of a portion bonded with the lead free solder while accommodating high temperature of the operating environment, but also reduce unnecessary stress concentration on a part of the semiconductor chip due to creep. Therefore, the lead free solder described above is suitable for semiconductor chip 12, which is made of SiC substrate that can operate at high temperature and has a large Young's modulus.

In particular, the lead free solder described above may be used for the solder 26. By using the terminal member 20 shown in the preceding embodiment, even if the thermal stress acting on the solder 22 increases, high connection reliability can be maintained.

Further, the lead free solder described above may be used for the solder 18. The solder 18 can maintain high connection reliability even when receiving thermal stress based on a difference in coefficient of linear expansion between the semiconductor chip 12 and the first heat sink 16.

In addition, since the Young's modulus of the semiconductor chip 12 is large, the solders 18, 22 around the semiconductor chip 12 creep when a power cycle test is carried out. As the number of cycles increases, there is concern about solder cracks or the like. On the other hand, by using the lead free solder described above, creep of the solders 18, 22 can be suppressed.

The lead free solder described above has characteristics such as excellent creep resistance, and is therefore effective in increasing the lifetime of the entire semiconductor device 10 regardless of the configurations of the terminal member 20 and the heat sinks 16, 24. For that reason, in a configuration in which the clad member is not used for each component, the lead free solder may be used for at least one of the solders 18, 22, and 26.

Figure 16:
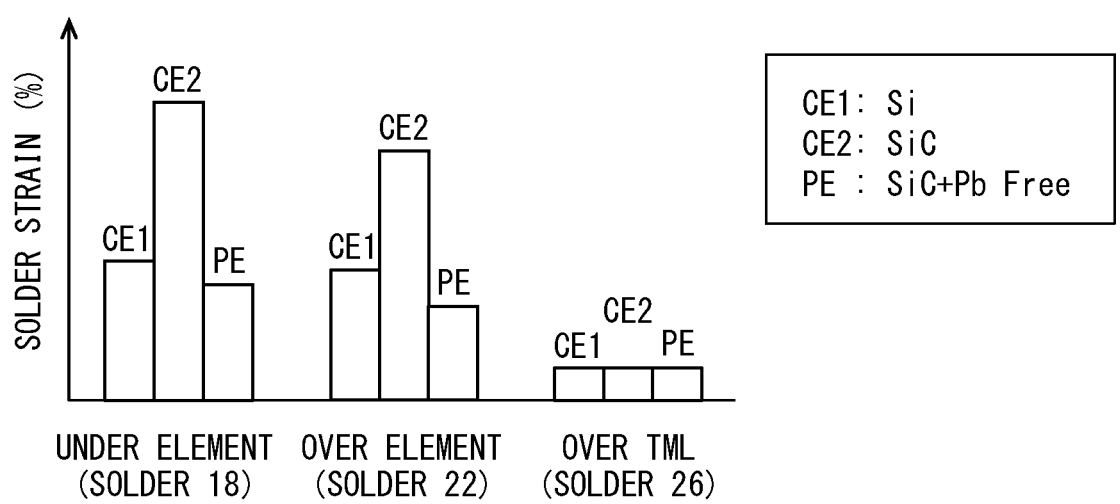
FIG. 16 is a diagram showing a result of solder strain simulation for Pb free solder applied to a semiconductor device according to a fourth embodiment.

FIG. 16 shows simulation results of solder strain. FIG. 16 shows the results of the configuration in which the clad member is not used for the terminal member 20 and the heat sinks 16, 24. "Under element" refers to the solder 18 directly under the semiconductor chip 12, "over element" refers to the solder 22 directly on the semiconductor chip 12, and "over TML" refers to the solder 26 on the terminal member 20. Comparative example 1 (CE1 shown in FIG. 16) shows the result of using solder of a conventional configuration in which a semiconductor chip is made of a Si substrate. Comparative example 2 (CE2 shown in FIG. 16) shows the result of a configuration in which the Si substrate of the comparative example 1 is replaced with the SiC substrate. The present example (PE shown in FIG. 16) shows the result of a configuration in which the solder of the comparative example 2 is replaced with the lead free solder described above.

As shown in FIG. 16, when Si is replaced with SiC having Young's modulus larger than that of Si, the solder strain of the solders 18, 22 around the semiconductor chip 12 increases. When the lead free solder described above is used, the solder strain of both the solders 18, 22 can be reduced. As described above, the lead free solder is suitable even in a configuration in which the clad member is not used for the terminal member 20 and the heat sinks 16, 24.

The present disclosure is not limited to the embodiments shown as examples. The disclosure encompasses the embodiments shown as examples and modifications based on the embodiments by a person skilled in the art. For example, the disclosure is not limited to the combinations of the elements described in the embodiments. The disclosure may be implemented in various combinations. The disclosed technical scope is not limited to the description of the embodiments. Several technical scopes disclosed are indicated by descriptions in the claims and should be understood to include all modifications within the meaning and scope equivalent to the descriptions in the claims.

Although the 2 in 1 package structure including the semiconductor chip 12H of the upper arm and the semiconductor chip 12L of the lower arm has been described as an example of the semiconductor device 10, the present disclosure is not limited to such a structure. The semiconductor device 10 can be applied to the 1 in 1 package structure including one semiconductor chip 12 forming one arm or the 6 in 1 package structure including six semiconductor chips 12 forming upper and lower arms for three phases as well.

Although the example in which the heat dissipation surfaces 16b, 24b of the heat sinks 16, 24 are exposed from the sealing resin body 14 has been described, the present disclosure is not limited to such a configuration. At least one of the dissipation surfaces 16b, 24b may be covered with the sealing resin body 14.

Although the MOSFET 6 has been described as the example of an element formed in the semiconductor chip 12, the present disclosure is not limited to such a configuration. The element may be a vertical element applied to a power conversion device. For example, it can be applied to an insulated gate bipolar transistor (IGBT) or a schottky barrier diode (SBD). In the case of the IGBT, the IGBT and a freewheel diode (FWD) may be formed in the same chip or may be formed in separate chips.

Although the example of applying the polyamide resin to improve the adhesion to the sealing resin body 14 has been described, the present disclosure is not limited to such a configuration. It can be applied to a configuration in which the polyamide resin is not applied. Further, instead of the polyamide resin, the adhesion may be increased by roughening the surface with laser processing. In this case, for example, in the step of preparing respective members, the surface may be roughened by irradiating the respective members with a laser beam.

The SiC substrate has been described as the example of a semiconductor substrate constituting the semiconductor chip 12. However, the present disclosure can also be applied to a semiconductor substrate other than SiC, which have having a larger Young's modulus than Si.

A film for enhancing wettability with solder may be formed on the mounting surface 16a of the first heat sink 16, the solder bonding surface of the terminal member 20, or the mounting surface 24a of the second heat sink 24 by plating, sputtering, or the like. A Ni based thin film, for example, a NiP plating film may be provided. Further, the wettability of the solder may be partially reduced by irradiating a laser beam after providing a Ni based thin film on the entire surface of the terminal member 20. An oxide film containing Ni as a main component and having fine asperities on the surface is formed by irradiation with a laser beam. The wettability can be reduced by the oxide film.

What is claimed is:

1. A semiconductor device comprising:
    a semiconductor chip including a SiC substrate formed with an element, the semiconductor chip having main electrodes on one surface and a rear surface opposite to the one surface in a plate thickness direction;
    a first heat sink and a second heat sink, as a pair of heat sinks, being disposed so as to interpose the semiconductor chip therebetween in the plate thickness direction, the first heat sink being adjacent to the one surface of the semiconductor chip, the second heat sink being adjacent to the rear surface of the semiconductor chip;
    a terminal member being interposed between the second heat sink and the semiconductor chip, the terminal member electrically interconnecting the second heat sink and the main electrode on the rear surface; and
    a plurality of bonding members being disposed between the main electrode on the one surface and the first heat sink, between the main electrode on the rear surface and the terminal member, and between the terminal member and the second heat sink, respectively, wherein
    the terminal member is provided by a plurality of types of metal layers that are stacked in the plate thickness direction,
    the terminal member as a whole has a coefficient of linear expansion at least in a direction orthogonal to the plate thickness direction in a range larger than that of the semiconductor chip and smaller than that of the second heat sink, and
    the plurality of types of metal layers of the terminal member are symmetrically arranged in the plate thickness direction.

2. The semiconductor device according to claim 1, wherein
    the plurality of types of metal layers includes a Cu layer and an alloy layer containing Cu, and
    the terminal member is a clad member in which the Cu layer and the alloy layer are layered in three or more layers in sequence.

3. The semiconductor device according to claim 2, wherein
    the terminal member has the Cu layer in a surface layer in the plate thickness direction.

4. The semiconductor device according to claim 2, wherein
    the terminal member has the alloy layer in a surface layer in the plate thickness direction.

5. The semiconductor device according to claim 2, wherein
    the alloy layer contains Cr.

6. The semiconductor device according to claim 1, wherein
    at least one of the plurality of bonding members includes a lead free solder that contains 3.2 to 3.8 mass % Ag, 0.6 to 0.8 mass % Cu, and 0.01 to 0.2 mass % Ni, as well as Sb and Bi.

7. A semiconductor device comprising:
    a semiconductor chip including a SiC substrate formed with an element, the semiconductor chip having main electrodes on one surface and a rear surface opposite to the one surface in a plate thickness direction;
    a first heat sink and a second heat sink, as a pair of heat sinks, being disposed so as to interpose the semiconductor chip therebetween in the plate thickness direction, the first heat sink being adjacent to the one surface of the semiconductor chip, the second heat sink being adjacent to the rear surface of the semiconductor chip;
    a terminal member being interposed between the second heat sink and the semiconductor chip, the terminal member electrically interconnecting the second heat sink and the main electrode on the rear surface; and
    a plurality of bonding members being disposed between the main electrode on the one surface and the first heat sink, between the main electrode on the rear surface and the terminal member, and between the terminal member and the second heat sink, respectively, wherein
    the terminal member is provided by a clad member having three or more layers layered in the plate thickness direction,
    the three or more layers include a Cu layer and an alloy layer containing Cu and Cr, and
    the Cu layer and the alloy layer are symmetrically arranged in the plate thickness direction.

8. The semiconductor device according to claim 7, wherein
    at least one of the first heat sink and the second heat sink includes a clad member having three or more layers, and
    the three or more layers includes a Cu layer and an alloy layer containing Cu that are layered in sequence.

9. The semiconductor device according to claim 8, further comprising:
    a sealing resin body integrally sealing the semiconductor chip, the terminal member, the bonding members, the first heat sink, and the second heat sink, wherein
    the alloy layer of the at least one of the first heat sink and the second heat sink contains Cr, and is exposed from the sealing resin body to have a surface coplanar with a surface of the sealing resin body.

10. The semiconductor device according to claim 7, wherein
    at least one of the plurality of bonding members includes a lead free solder that contains 3.2 to 3.8 mass % Ag, 0.6 to 0.8 mass % Cu, and 0.01 to 0.2 mass % Ni, as well as Sb and Bi.

* * * * *